US011870236B2

(12) United States Patent
Takuma et al.

(10) Patent No.: US 11,870,236 B2
(45) Date of Patent: *Jan. 9, 2024

(54) OVERCURRENT PROTECTION CIRCUIT

(71) Applicant: Rohm Co., Ltd., Kyoto (JP)

(72) Inventors: Toru Takuma, Kyoto (JP); Shuntaro Takahashi, Kyoto (JP); Naoki Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/592,807

(22) Filed: Feb. 4, 2022

(65) Prior Publication Data

US 2022/0158436 A1 May 19, 2022

Related U.S. Application Data

(63) Continuation of application No. 16/856,531, filed on Apr. 23, 2020, now Pat. No. 11,289,894, which is a continuation of application No. 15/672,958, filed on Aug. 9, 2017, now Pat. No. 10,658,831.

(30) Foreign Application Priority Data

Aug. 10, 2016 (JP) ................................. 2016-157832

(51) Int. Cl.
*H02H 3/08* (2006.01)
*H02H 9/02* (2006.01)
*B60R 16/02* (2006.01)
*G05F 1/573* (2006.01)
*G06F 1/30* (2006.01)
*H03K 19/003* (2006.01)
(Continued)

(52) U.S. Cl.
CPC ............... *H02H 3/08* (2013.01); *B60R 16/02* (2013.01); *G05F 1/573* (2013.01); *G06F 1/305* (2013.01); *H02H 9/02* (2013.01); *H02H 9/025* (2013.01); *H03K 19/00315* (2013.01); *H02H 3/085* (2013.01); *H02H 5/04* (2013.01); *H03K 2017/0806* (2013.01)

(58) Field of Classification Search
CPC ............ H02H 3/08; H02H 9/02; H02H 9/025; H02H 5/04; H02H 3/085; B60R 16/02; G05F 1/573; G06F 1/30; G06F 1/305; H03K 19/003; H03K 19/00315; H03K 2017/0806
USPC .................... 361/93.7–93.9, 86–87, 103, 106
See application file for complete search history.

(56) References Cited

U.S. PATENT DOCUMENTS 10,658,831 B2 * 5/2020 Takuma .................... H02H 9/02
11,289,894 B2 * 3/2022 Takuma .................... H02H 9/02
2004/0178759 A1 9/2004 Nakamura
(Continued)

FOREIGN PATENT DOCUMENTS

JP 2000-201484 7/2000

*Primary Examiner* — Danny Nguyen
(74) *Attorney, Agent, or Firm* — Fish & Richardson P.C.

(57) ABSTRACT

An overcurrent protection circuit includes a current control part configured to control conductance of a transistor so as to limit an output current flowing when the transistor is turned on to a predetermined upper limit or less, and a duty control part configured to forcibly turning on/off the transistor at a predetermined duty ratio when a temperature protection circuit detects a temperature abnormality in a state where the current control part limits the output current.

13 Claims, 15 Drawing Sheets

(51) Int. Cl.
    *H02H 5/04*         (2006.01)
    *H03K 17/08*       (2006.01)

(56)           References Cited

U.S. PATENT DOCUMENTS

| | | |
|---|---|---|
| 2008/0002325 A1 | 1/2008 | Kato |
| 2014/0092653 A1 | 4/2014 | Suzuki |
| 2014/0239870 A1 | 8/2014 | Nawa |
| 2015/0364913 A1 | 12/2015 | Minoya |
| 2018/0048140 A1 | 2/2018 | Takuma et al. |
| 2019/0243715 A1 | 8/2019 | Dewa et al. |
| 2020/0251894 A1 | 8/2020 | Takuma et al. |

\* cited by examiner

OVERCURRENT PROTECTION CIRCUIT

CROSS-REFERENCE TO RELATED APPLICATION

This application is a continuation of U.S. patent application Ser. No. 16/856,531, filed Apr. 23, 2020, which is a continuation of U.S. patent application Ser. No. 15/672,958, filed Aug. 9, 2017, now U.S. Pat. No. 10,658,831, which claims the benefit of priority from Japanese Patent Application No. 2016-157832, filed on Aug. 10, 2016, the entire contents of which are incorporated herein by reference.

TECHNICAL FIELD

The present disclosure relates to an overcurrent protection circuit.

BACKGROUND

Conventionally, many semiconductor integrated circuit devices include an overcurrent protection circuit which is one of abnormality protection circuits. For example, an in-vehicle IPD (Intelligent Power Device) includes an overcurrent protection circuit so as to prevent the device from being destroyed even when a load connected to a power transistor is short-circuited.

By the way, there is also a load (a capacitive load, etc.) connected to the power transistor that requires a large output current instantaneously in a normal operation. Therefore, the conventional overcurrent protection circuit adopts a current control mode of limiting an output current to a predetermined upper limit value or less, instead of cutting off the output current at the time of short-circuiting of the load, in which a determination on whether to cut off the output current is delegated to a temperature protection circuit (a so-called thermal shutdown circuit) that detects a device temperature abnormality.

In many cases, the temperature protection circuit is of a self-resetting type of forcibly turning off the power transistor when a junction temperature of the device is higher than an abnormality detection value (for example, 175 degrees C.) while releasing the forced-off of the power transistor when the junction temperature is lower than an abnormality release value (for example, 150 degrees C.).

However, in the case of adopting the above-described conventional abnormality protection method (the current control mode the self-resetting type thermal shutdown), at the time of load short-circuit, the device will continue to operate in a high temperature range (for example, 150 degrees C. to 175 degrees C.) where the detection and release of temperature abnormality with an overcurrent are repeated. Therefore, there is a room for further improvement on the safety of the device.

In particular, in recent years, it has been required to comply with ISO 26262 (the international standards for electric/electronic-related functional safety of vehicles) for in-vehicle ICs and a higher reliability design becomes also important for in-vehicle IPD.

SUMMARY

Some embodiments of the present disclosure provide an overcurrent protection circuit capable of securing an instantaneous current while improving safety.

According to an embodiment of the present disclosure, an overcurrent protection circuit is provided. The overcurrent protection circuit includes: a current control part configured to control conductance of a transistor so as to limit an output current flowing when the transistor is turned on to a predetermined upper limit or less; and a duty control part configured to forcibly turn on/off the transistor at a predetermined duty ratio when a temperature protection circuit detects a temperature abnormality in a state where the current control part limits the output current.

In some embodiments, the current control part may be configured to compare a sense voltage corresponding to the output current with a threshold voltage corresponding to the upper limit and generate a first overcurrent protection signal for controlling the conductance of the transistor and a status notification signal for notifying the duty control part of a state where the current control part limits the output current.

In some embodiments, the duty control part may include: a latch which configured to switch and hold a pulse generation control signal from a logic level at the time of disabling to a logic level al the time of enabling when the state notification signal is al a logic level at the time of current limitation and a temperature protection signal is at a logic level at the time of abnormality detection; a pulse signal generation part configured to generate a pulse signal having the duty ratio while the pulse generation control signal is at the logic level at the time of enabling; and a level shifter configured to generate a second overcurrent protection signal for forcibly turning on/off the transistor at the duty ratio by level-shifting the pulse signal.

In some embodiments, the pulse signal generation part may be configured to continue generating the pulse signal until the pulse generation control signal is reset to the logic level at the time of disabling.

According to another embodiment of the present disclosure, a semiconductor integrated circuit device is provided. The semiconductor integrated circuit device includes: a transistor configured to conduct/interrupt a current path through which an output current flows; a gate control part configured to generate a driving signal of the transistor in response to a control signal; a temperature protection circuit configured to detect a temperature abnormality of the device; and the overcurrent protection circuit.

In some embodiments, the temperature protection circuit may be configured to monitor a temperature of the transistor and detect a temperature abnormality.

In some embodiments, a first temperature detecting element for detecting the temperature of the transistor may be disposed near a pad of the transistor within a formation region of the transistor.

In some embodiments, the temperature protection circuit may be formed adjacent to the transistor and the first temperature detecting element is disposed near a corner closest to the temperature protection circuit among four corners of the pad.

In some embodiments, the temperature protection circuit may be configured to monitor a temperature difference between a temperature of the transistor and a temperature of another integrated circuit and detect a temperature abnormality.

In some embodiments, the temperature protection circuit may be formed adjacent to the transistor and a second temperature detecting element for detecting the temperature of the another integrated circuit may be disposed in a formation region of the temperature protection circuit.

According to another embodiment of the present disclosure, an electronic apparatus is provided. The electronic apparatus includes the semiconductor integrated circuit device, and a load connected to the semiconductor integrated circuit device.

In some embodiments, the load may be a bulb lamp, a relay coil, a solenoid a light emitting diode or a motor. According to another embodiment of the present disclosure, a vehicle including the electronic apparatus is provided.

DETAILED DESCRIPTION

Figure 1:
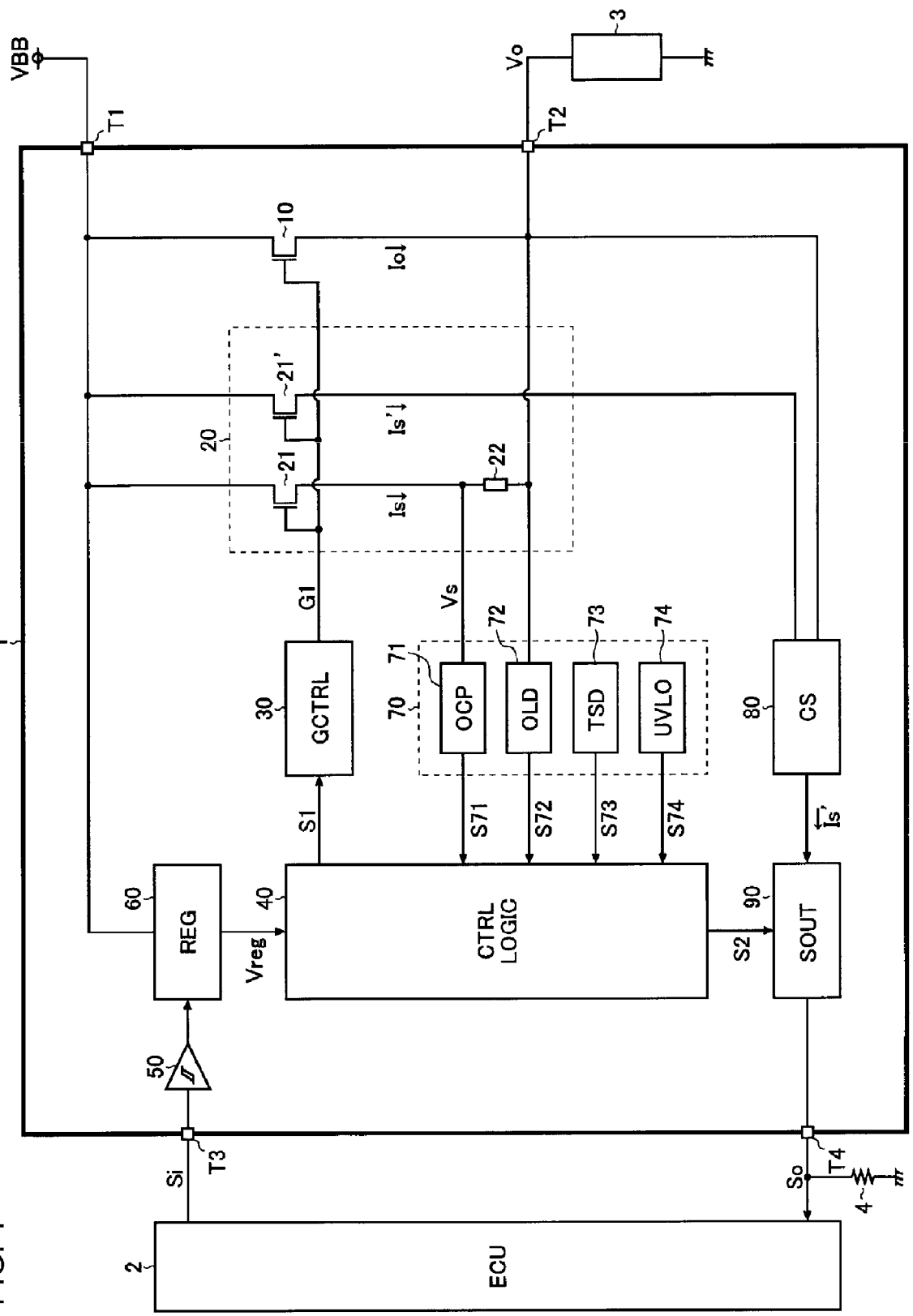
FIG. 1 is a block diagram showing a semiconductor integrated circuit device according to a first embodiment.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

Semiconductor Integrated Circuit Device (First Embodiment

FIG. 1 is a block diagram showing a semiconductor integrated circuit device according to a first embodiment. The semiconductor integrated circuit device 1 of this embodiment includes an in-vehicle high-side switch IC (which is a type of the in-vehicle IPD) that connects/disconnects between the application terminal of a power supply voltage VBB and a load 3 according to an instruction from an ECU (Electronic Control Unit) 2.

The semiconductor integrated circuit device 1 includes external terminals T1 to T4 for establishing electrical connection with the external of the device. The external terminal T1 is a power supply terminal (VBB pin) for receiving the power supply voltage VBB (for example, 12V) from a battery (not shown). The external terminal T2 is a load connection terminal (OUT pin) for externally connecting the load 3 (a bulb lamp, a relay coil, a solenoid, a light emitting diode, a motor, etc.). The external terminal T3 is a signal input terminal (IN pin) for receiving an external input of an external control signal Si from the ECU 2. The external terminal T4 is a signal output terminal (SENSE pin) for externally outputting a status signal So to the ECU 2. An external sense resistor 4 is externally connected between the external terminal T4 and the ground terminal.

The semiconductor integrated circuit device 1 includes an NMOSFET 10, an output current monitoring part 20, a gate control part 30, a control logic part 40, a signal input part 50, an internal power supply part 60, an abnormality protection part 70, an output current detection part 80 and a signal output part 90.

The NMOSFET 10 is a high-breakdown voltage (for example, 42V breakdown voltage) power transistor having a drain connected to the external terminal T1 and a source connected to the external terminal T2. The NMOSFET 10 thus connected functions as a switch element (high-side switch) tier connecting/disconnecting a current path ranging from the application terminal of the power supply voltage VBB to the ground terminal via the load 3. The NMOSFET 10 is turned on when the gate driving signal G1 is at a high level, and is turned off when the gate driving signal G1 is at a low level.

The NMOSFET 10 may be designed so that its on-resistance value is several tens of mΩ. However, the lower the on-resistance value of the NMOSFET 10, the more likely it is for an overcurrent to flow at the time of ground fault of the external terminal T2 (i.e., at the time of short-circuit to the ground terminal or an equivalent low potential terminal), which may result in generation of abnormal heat. Therefore, as the on-resistance value of the NMOSFET 10 becomes lower and lower, an overcurrent protection circuit 71 and a temperature protection circuit 73 to be described later are of more importance.

The output current monitoring part 20 includes NMOSFETs 21 and 21' and a sense resistor 22 and generates a sense voltage Vs corresponding to an output current Io flowing through the NMOSFET 10.

Both of the NMOSFETs 21 and 21' are mirror transistors connected in parallel to the NMOSFET 10 and generate sense currents Is and Is' respectively according to the output current Io. The size ratio between the NMOSFFT 10 and the NMOSFETs 21 and 21' is m:1 (where m>1). Therefore, the sense currents Is and Is' are equal to 1/m of the output current Io. Like the NMOSFET 10, the NMOSFETs 21 and 21' are turned on when the gate driving signal G1 is at a high level, and are turned off when the gate voltage G1 is at a low level.

The sense resistor 22 (its resistance: Rs) is connected between the source of the NMOSFET 21 and the external terminal T2 and is a current/voltage conversion element that generates a sense voltage Vs (=Is×Rs+Vo, where Vo represents an output voltage appearing on the external terminal T 2) corresponding to the sense current Is.

The gate control part 30 generates the gate drive signal G1 with the increased current capability of the gate control signal S10 and outputs the gate drive signal G1 to the gates of the NMOSFETs 10 and 21, thereby controlling the turning-on/off of the NMOSFETs 10 and 21.

The control logic part 40 receives an internal power supply voltage Vreg and generates the gate control signal S1. For example, when the external control signal Si is at a high level (a logic level when turning on the NMOSFET 10), since the internal power supply voltage Vreg is supplied from the internal power supply part 60, the control logic part 40 enters an operation state and the gate control signal S1 has a high level (=Vreg). On the other hand, when the external control signal S1 is at a low level (a logic level when turning off the NMOSFET 10), since the internal power supply voltage Vreg is not supplied from the internal power supply part 60, the control logic part 40 enters a non-operating state and the gate control signal S1 has a low level (=GND). In addition, the control logic part 40 monitors various abnormality protection signals (an overcurrent protection signal S71, an open protection signal S72, a temperature protection signal S73 and a reduced voltage protection signal S74). The control logic unit 40 also has a function of generating an output switching signal S2 based on a result of the monitoring on the overcurrent protection signal S71, the open protection signal S72 and the temperature protection signal S73 among the aforementioned abnormality protection signals.

The signal input part 50 is a Schmitt trigger that receives the external control signal Si from the external terminal T3 and transmits it to the internal power supply part 60. The external control signal Si is at a high level when the NMOSFET 10 is turned on, and is at a low level when the NMOSFET 10 is turned off.

The internal power supply part 60 generates a predetermined internal power supply voltage Vreg from the power supply voltage VBB and supplies it to each of the parts of the semiconductor integrated circuit device 1. Whether or not the internal power supply part 60 is operable is controlled according to the external control signal Si. More specifically, the internal power supply part 60 is in an operating state when the external control signal Si is at a high level, and is in a non-operating state when the external control signal Si is at a low level.

The abnormality protection part 70 is a circuit block for detecting various abnormalities of the semiconductor integrated circuit device 1 and includes an overcurrent protection circuit 71, an open protection circuit 72, a temperature protection circuit 73 and a reduced voltage protection circuit 74.

The overcurrent protection circuit 71 generates the overcurrent protection signal S71 based on a result of monitoring on the sense voltage Vs (i.e., based on a determination on whether or not an overcurrent abnormality of the output current Io occurs). For example, the overcurrent protection signal S71 has a low level when no abnormality is detected, and has a high level when an abnormality is detected.

The open protection circuit 72 generates the open protection signal S72 based on a result of monitoring on the output voltage Vo (i.e., based on a determination on whether or not an open abnormality of the load 3 occurs). For example, the open protection signal S72 has a low level when no abnormality is detected, and has a high level when an abnormality is detected.

The temperature protection circuit 73 includes a temperature detection element (not shown) for detecting a temperature abnormality in the semiconductor integrated circuit device 1 (particularly inside or near the NMOSFET 10) and generates the temperature protection signal S73 based on a result of the detection (i.e., based on a determination on whether or not a temperature abnormality occurs). For example, the temperature protection signal S73 has a low level when no abnormality is detected, and has a high level when an abnormality is detected.

The reduced voltage protection circuit 74 generates the reduced voltage protection signal S74 based on a result of monitoring on the power supply voltage VBB or the internal power supply voltage Vreg (i.e., based on a determination on whether or not a reduced voltage abnormality occurs). For example, the reduced voltage protection signal S74 has a low level when no abnormality is detected, and has a high level when an abnormality is detected.

The output current detection part 80 generates a sense current Is' (=Io/m) corresponding to the output current Io by matching the source voltage of the NMOSFET 21' with the output voltage Vo using a bias means (not shown) and outputs it to the signal output part 90.

Based on the output selection signal S2, the signal output unit 90 selectively outputs one of the sense current Is' (corresponding to the detection result of the output current Io) and a fixed voltage V90 (corresponding to an abnormality flag, which is not explicitly shown in this figure) to the external terminal T4. When the sense current Is' is selected and outputted, an output detection voltage V80 (=Is'×R4) obtained by current/voltage conversion of the sense current Is' with the external sense resistor 4 (its resistance: R4) is transmitted as the status signal So to the ECU2. The output detection voltage V80 increases with the increase in the output current Io and decreases with the decrease in the output current Io. On the other hand, when the fixed voltage V90 is selected and outputted, the fixed voltage V90 is transmitted as the status signal So to the ECU 2. In this embodiment, the fixed voltage V90 may be set to a voltage value higher than the upper limit value of the output detection voltage V80.

According to such a signal output unit 90, both the detection result of the output current Io and the abnormality flag can be transmitted to the ECU 2 by using the single status signal So, contributing to the reduction in the number of external terminals. When reading a current value of the output current Io out of the status signal So, an analog-to-digital (A/D) conversion may be performed on the status signal So. On the other hand, when reading the abnormality flag out of the status signal So, the logic level of the status signal So may be determined using a threshold value slightly lower than the fixed voltage V90.

Gate Control Part

Figure 2:
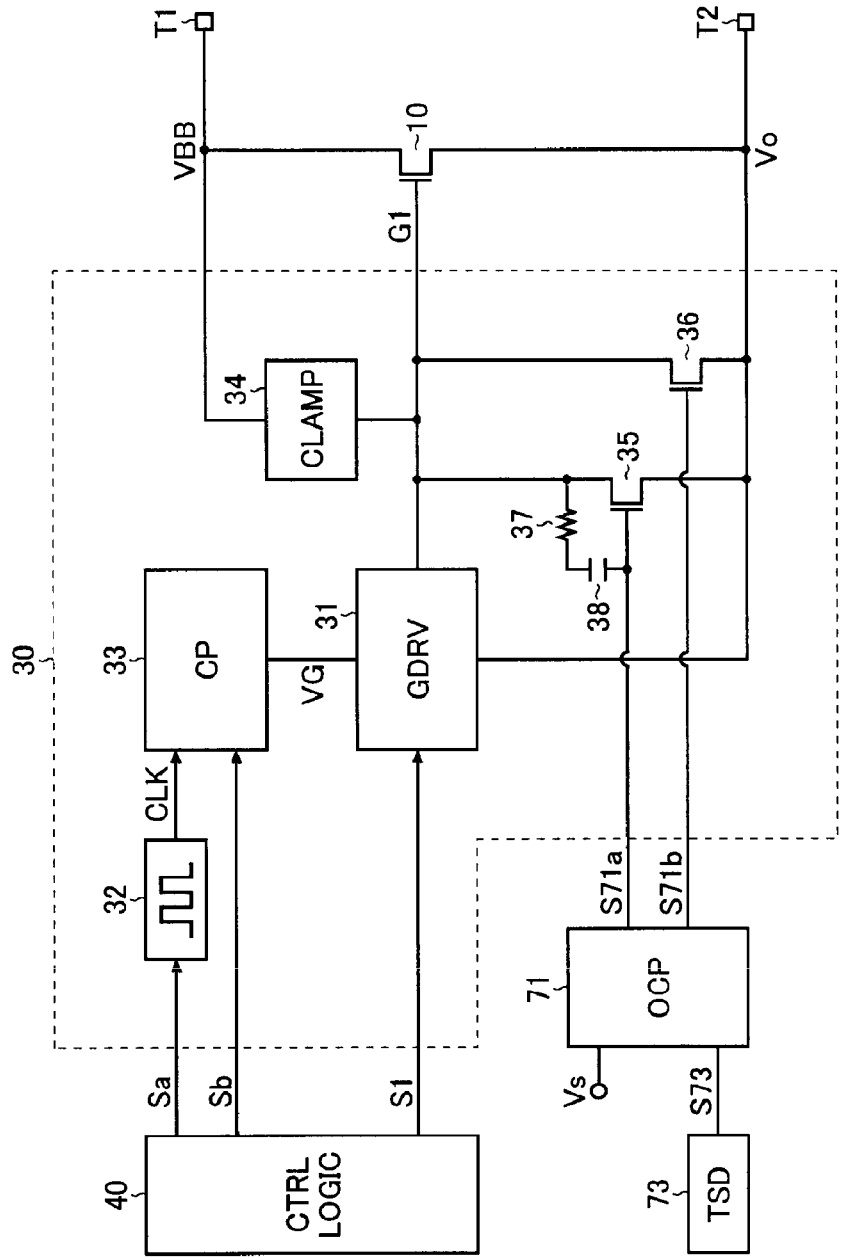
FIG. 2 is a block diagram showing a configuration example of a gate control part.

FIG. 2 is a block diagram showing a configuration example of the gate control part 30 and the peripheral portion thereof. The gate control part 30 of this configuration example includes a gate driver 31, an oscillator 32, a charge pump 33, a damper 34, NMOSFETs 35 and 36, a resistor 37 (its resistance: R37) and a capacitor 38 (its capacitance: C38).

The gate driver 31 is connected between the output terminal of the charge pump 33 (the application terminal of a boosted voltage VG) and the external terminal T2 (the application terminal of the output voltage Vo) and generates the gate driving signal G1 with the increased current capability of the gate control signal S1. Basically, the gate driving signal G1 has a high level (=VG) when the gate control signal S1 is at a high level, and has a low level (=Vo) when the gate control signal S1 is at a low level.

The oscillator 32 generates a clock signal CLK of a predetermined frequency and outputs it to the charge pump 33. Whether or not the oscillator 32 is operable is controlled according to an enable signal Sa from the control logic part 40.

The charge pump 33 generates the boosted voltage VG higher than the power supply voltage VBB by driving a flying capacitor (not shown) using the clock signal CLK. Whether or not the charge pump 33 is operable is controlled according to an enable signal Sb from the control logic part 40.

The damper 34 is connected between the external terminal T1 (the application terminal of the power supply voltage VBB) and the gate of the NMOSFET 10. In an application in which an inductive load 3 is connected to the external terminal T2, the output voltage Vo becomes a negative voltage (<GND) due to a counter electromotive force of the load 3 when switching the NMOSFET 10 from ON to OFF. Therefore, the damper 34 (a so-called active clamp circuit) is provided for energy absorption.

The drain of the NMOSFET 35 is connected to the gate of the NMOSFET 10. The source of the NMOSFET 35 is connected to the external terminal T2. A first overcurrent protection signal S71a (corresponding to the earlier-described overcurrent protection signal S71) is applied from the overcurrent protection circuit 71 to the gate of the NMOSFET 35. The resistor 37 and the capacitor 38 are connected in series between the drain and the gate of the NMOSFET 35.

The drain of the NMOSFFT 36 is connected to the gate of the NMOSFFT 10. The source of the NMOSFET 36 is connected to the external terminal T2. A second overcurrent protection signal S71b is applied from the overcurrent protection circuit 71 to the gate of the NMOSFET 36. However, unlike the NMOSFET 35, neither a resistor nor a capacitor is connected between the drain and the gate of the NMOSFET 36.

In the gate control part 30 of this configuration example, the NMOSFET 35 is turned off when the first overcurrent protection signal S71a is at a low level (a logic level at the time of abnormality non-detection), and is turned on when the first overcurrent protection signal S71a is at a high level (a logic level at the time of abnormality detection). Accordingly, when the first overcurrent protection signal S71a rises to the high level, the gate driving signal G1 is pulled down from the steady-state high level (=VG) with a predetermined time constant τ (=R37×C38). As a result, conductance of the NMOSFET 10 gradually decreases to limit the output current Io. On the other hand, when the first overcurrent protection signal S71a falls to the low level, the gate driving signal G1 is pulled up with the predetermined time constant τ. As a result, the conductance of the NMOSFET 10 gradually increases to cancel the limitation of the output current Io.

Further, the NMOSFET 36 is turned off when the second overcurrent protection signal S71b is at a low level (a logic level at the time of cancellation of forced-off), and is turned on when the second overcurrent protection signal S71b is at a high level (a logic level at the time of forced-off). Accordingly, when the second overcurrent protection signal S71b rises to the high level, since the gate and the source of the NMOSFET 10 are shorn-circuited, the NMOSFET 10 is forcibly turned off and the output current Io is interrupted without delay. On the other hand, when the second overcurrent protection signal S71b falls to the low level, the gate and the source of the NMOSFET 10 are disconnected from each other, the forced-off of the NMOSFET 10 is canceled.

As described above, the overcurrent protection circuit 71 of this configuration example employs two control methods thereof, i.e., a current control mode for controlling the conductance of the NMOSFET 10 using the first overcurrent protection signal S71a and a duty control mode for forcibly turning on/off the NMOSFET 10 using the second overcurrent protection signal S71b, and is configured to switch from the current control mode to the duty control mode in response to the temperature protection signal S73 input from the temperature protection circuit 73.

In the following description, structures and operations of the temperature protection circuit 73 and the overcurrent protection circuit 71 will be sequentially described in detail.

Temperature Protection Circuit

Figure 3:
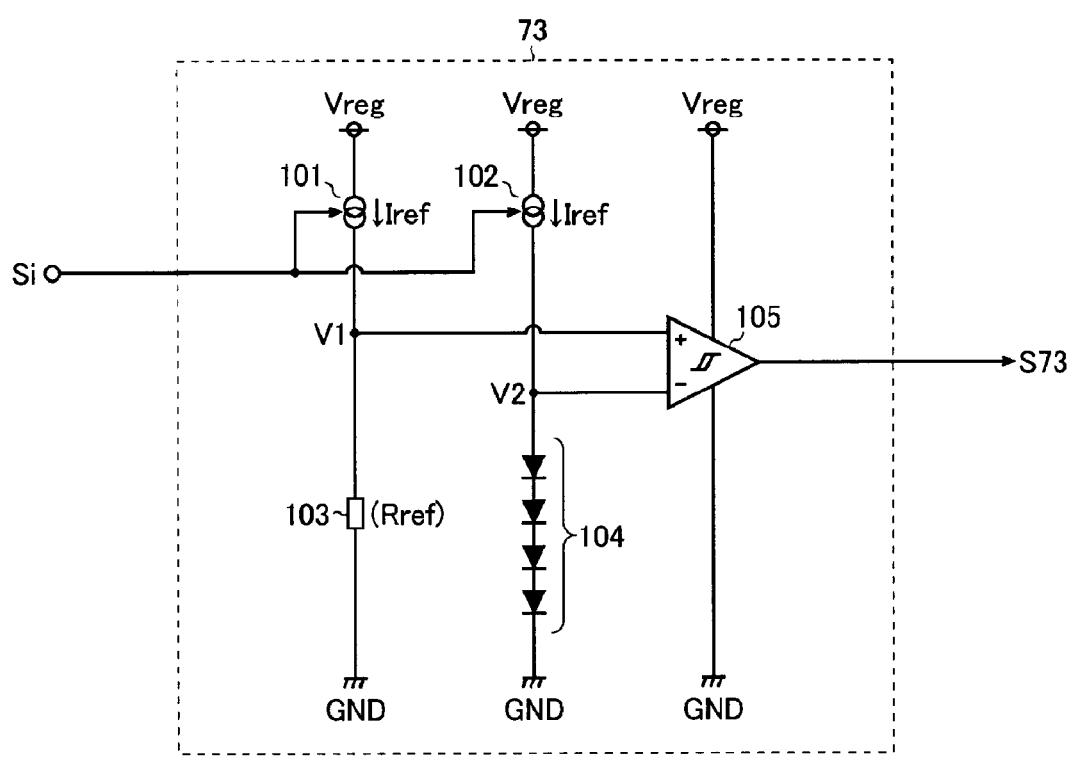
FIG. 3 is a circuit diagram showing a configuration example of a temperature protection circuit.

FIG. 3 is a circuit diagram showing a configuration example of the temperature protection circuit 73. The temperature protection circuit 73 of this configuration example is a circuit block for detecting a temperature abnormality by monitoring a junction temperature Tj inside or ear the NMOSFET 10 and includes current sources 101 and 102, a resistor 103, a diode array 104 and a comparator 105.

The first terminals of the current sources 101 and 102 and the power supply potential terminal of the comparator 105 are both connected to the application terminal of the internal power supply voltage Vreg. The second terminal of the current source 101 and the first terminal of the resistor 103 are both connected to the non-inverting input terminal (+) of the comparator 105. The second terminal of the current source 102 and the anode terminal of the diode array 104 are both connected to the inverting input terminal (−) of the comparator 105. The second terminal of the resistor 103, the cathode terminal of the diode array 104 and the reference potential terminal of the comparator 105 are all connected to the ground terminal GND. The output terminal of the comparator 105 corresponds to the output terminal of the temperature protection signal S73.

Each of the current sources 101 and 102 generates a predetermined reference current Iref when the external control signal Si is at a high level.

The diode array 104 may be provided at a position where the junction temperature Tj inside or near the NMOSFET 10 can be detected. In the example of this figure, the number of serial stages of diodes forming the diode array 104 is four. However, this is merely an example and the number of serial stages of diodes is arbitrary.

The comparator 105 compares a node voltage V1 (a constant voltage having a temperature characteristic of zero or near zero) input to a non-inverting input terminal (+) and a node voltage V2 (an anode voltage of the diode array 104 having the negative temperature characteristic) input to an inverting input terminal (−), thereby generating the temperature protection signal S73. The temperature protection signal S73 has a high level (a logic level when a temperature abnormality is detected, Vreg) when the node voltage V1 is higher than the node voltage V2, and has a low level (a logic level when no temperature abnormality is detected, GND) when the node voltage V1 is lower than the node voltage V2.

In addition, the comparator 105 may have a hysteresis characteristic. For example, the input stage of the comparator 105 may be controlled such that the node voltage V1 and the node voltage V2 are compared with each other when the temperature protection signal S73 is at the low level, and an addition voltage (V1+Vhys), which is obtained by adding a hysteresis voltage Vhys to the node voltage V1, and the node voltage V2 are compared with each other when the temperature protection signal S73 is at the high level.

Figure 4:
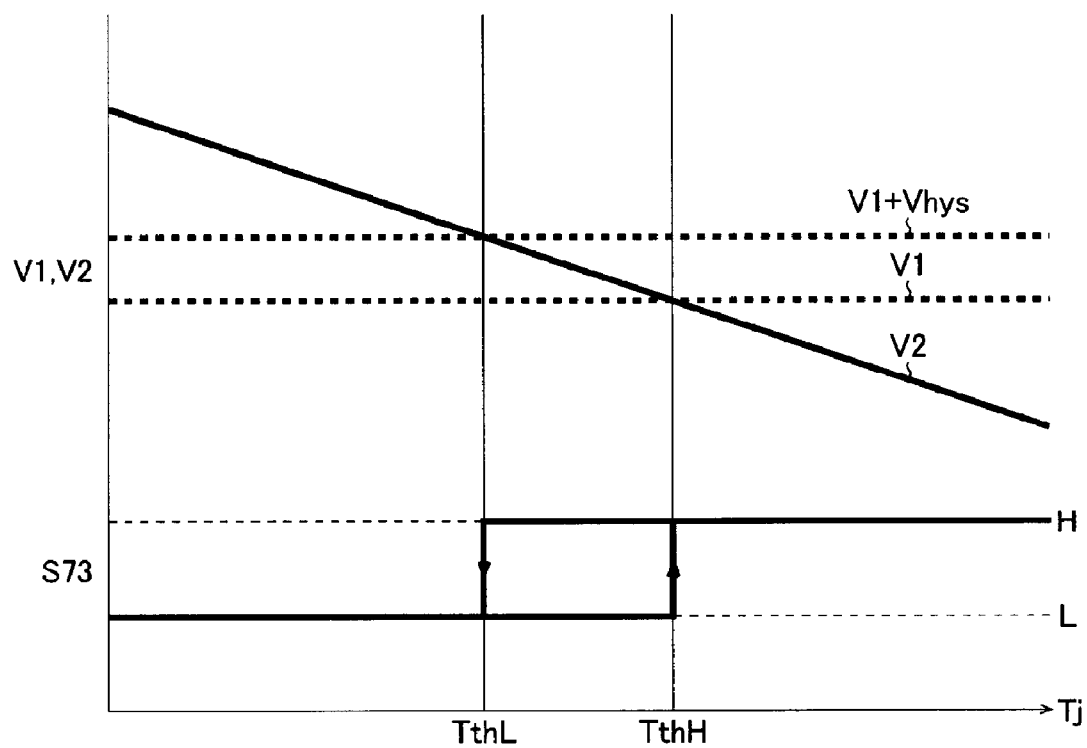
FIG. 4 is a view for explaining an operation of generating a temperature protection signal.

FIG. 4 is a view for explaining an operation of generating the temperature protection signal S73, in which the node voltages V1 and V2 and the temperature protection signal S73 are depicted in order from the top. In this figure, the horizontal axis represents the junction temperature Tj.

When the temperature protection signal S73 is at the low level, the comparator 105 is in a state of comparing the node voltage V1 and the node voltage V2. In such a state, when the junction temperature Tj is higher than an upper threshold temperature TthH (for example, 175 degrees C.) and the node voltage V2 is lower than the node voltage V1, the temperature protection signal S73 rises to the high level.

On the other hand, when the temperature protection signal S73 is at the high level, the comparator 105 is in a state of comparing the addition voltage (V1+Vhys), which is obtained by adding the hysteresis voltage Vhys to the node voltage V1, and the node voltage V2. In such a state, when the junction temperature Tj is lower than a lower threshold temperature TthL (for example, 150 degrees C.) and the node voltage V2 is higher than the addition voltage (V1+Vhys), the temperature protection signal S73 falls to the low level.

Overcurrent Protection Circuit

Figure 5:
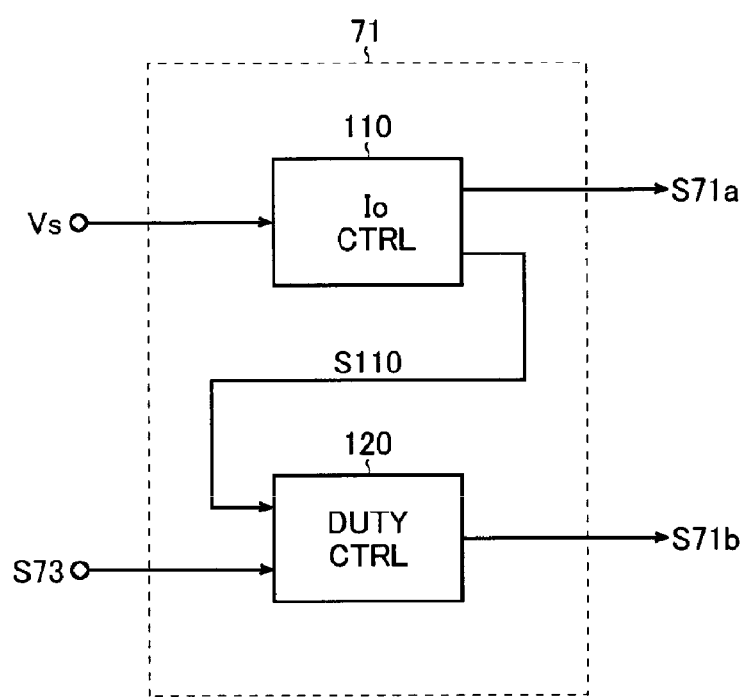
FIG. 5 is a block diagram showing a configuration example of an overcurrent protection circuit.

FIG. 5 is a block diagram showing a configuration example of the overcurrent protection circuit 71. The overcurrent protection circuit 71 of this configuration example includes a current control part 110 and a duty control part 120.

The current control part 110 compares the sense voltage Vs (corresponding to the output current Io) with a predetermined threshold voltage Vth (corresponding to the upper limit value of the output current Io, not shown in this figure) to generate the first overcurrent protection signal S71a for controlling the conductance of the NMOSFET 10. Based on a result of the comparison, the current control part 110 has a function to generate a state notification signal S110 for notifying the duty control part 120 of a state where the current control part 110 limits the output current Io (S71a=H).

The duty control part 120 receives the state notification signal S110 and the temperature protection signal S73 and generates the second overcurrent protection signal S71b. More specifically, when the temperature protection circuit 73 detects a temperature abnormality (S73=H) in a state where the current control part 110 limits the output current Io (S110=H), the duty control part 120 starts to generate a pulse of the second overcurrent protection signal S71b and forcibly turns on/off the NMOSFET 10 at a predetermined duty ratio Don.

Hereinafter, the circuit configurations and operations of the above-described functional parts will be described in more detail.

Current Control Part

Figure 6:
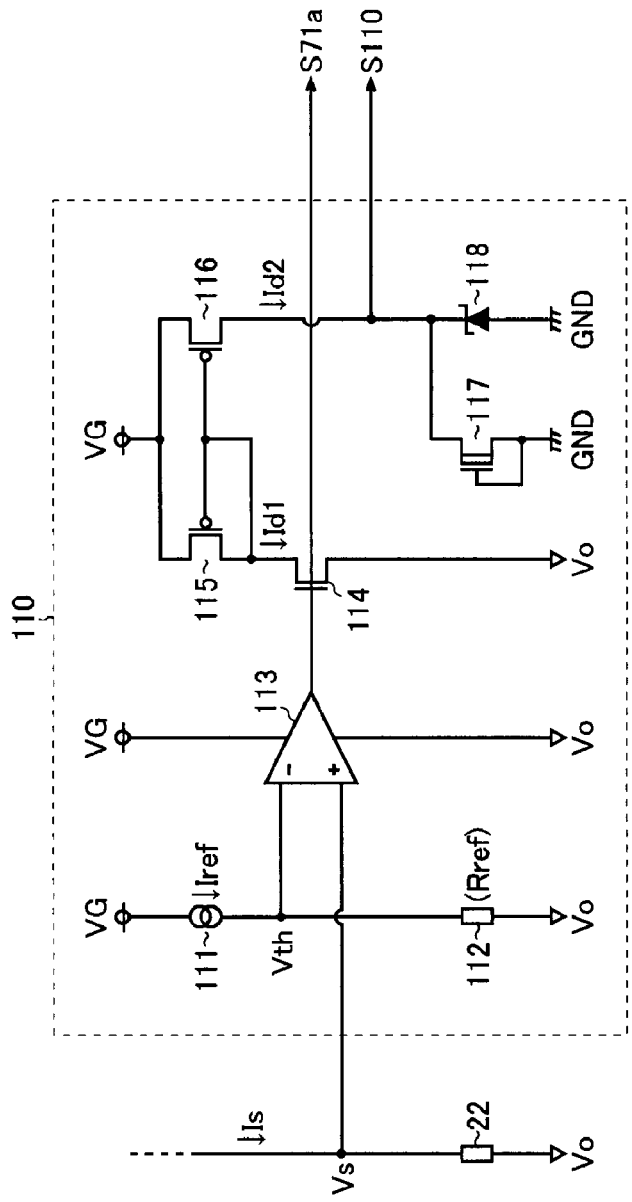
FIG. 6 is a circuit diagram showing a configuration example of a current control part.

FIG. 6 is a circuit diagram showing a configuration example of the current control part 110. The current control part 110 of this configuration example includes a current source 111, a resistor 112 (resistance: Rref), a comparator 113, an NMOSFET 114, PMOSFETs 115 and 116, a depletion type NMOSFET 117 and a Zener diode 118.

A first terminal of the current source 111 and a power supply potential terminal of the comparator 113 are both connected to the application terminal of the boosted voltage VG. A second terminal of the current source 111 and a first terminal of the resistor 112 are both connected to an inverting input terminal (+) of the comparator 113. The sense voltage Vs is input to the non-inverting input terminal (−) of the comparator 113. The second terminal of the resistor 112 and a reference potential terminal of the comparator 113 are both connected to the application terminal of the output voltage Vo. An output terminal of the comparator 113 corresponds to the output terminal of the first overcurrent protection signal S71a.

A gate of the NMOSFET 114 is connected to an output terminal of the comparator 113. A source of the NMOSFET 114 is connected to the application terminal of the output voltage Vo. A drain of the NMOSFET 114 is connected to a drain of the PMOSFET 115. Each of the sources of the PMOSFETs 115 and 116 is connected to the application terminal of the boosted voltage VG. Each of the gates of the PMOSFETs 115 and 116 is connected to the drain of the PMOSFET 115. A drain of the PMOSFET 116 is connected to a drain of the NMOSFET 117 and a cathode of the Zener diode 118. A gate and a source of the NMOSFET 117 and an anode of the Zener diode 118 are both connected to the ground terminal GND. The drain of the PMOSFET 116 corresponds to the output terminal of the state notification signal S110.

The current source 111 generates a predetermined reference current Iref and supplies it to the resistor 112. Accordingly, a predetermined threshold voltage Vth (=Iref×Rref) is input to the inverting input terminal (−) of the comparator 113. A voltage value of the threshold voltage Vth may be determined according to the upper limit value of the output current Io.

The comparator 113 compares the sense voltage Vs input to the non-inverting input terminal (+) with the threshold voltage Vth input to the inverting input terminal (−) to generate the first overcurrent protection signal S71a. The first overcurrent protection signal S71a has a low level (a logic level when no abnormality is detected) when the sense voltage Vs is lower than the threshold voltage Vth, and has a high level (a logic level when an abnormality is detected) when the sense voltage Vs is higher than the threshold voltage Vth.

The NMOSFET 114 is turned off when the first overcurrent protection signal S71a is at the low level, and is turned on when the first overcurrent protection signal S71a is at the high level. The PMOSFETs 115 and 116 form a current mirror and mirror a drain current Id1 of the PMOSFET 115 to generate a drain current Id2 of the PMOSFET 116. The depletion type NMOSFET 117 functions as a constant current source since its gate and source are interconnected. The Zener diode 118 functions as a clamping element for limiting the upper limit value of the status notification signal S110.

In the current control part 110 of this configuration example, since the NMOSFET 114 is turned off when the first overcurrent protection signal S71a is at the low level, a current path ranging from the drain of the PMOSFET 115 to the application terminal of the output voltage Vo is interrupted. Accordingly, the drain currents Id1 and Id2 do not flow and the state notification signal S110 has a low level (a logic level when the limitation of the output current Io is released).

On the other hand, since the NMOSFET 114 is turned on when the first overcurrent protection signal S71a is at the high level, the above current path is in a conducting state. Accordingly, since the drain currents Id1 and Id2 flow, the state notification signal S110 has a high level (a logic level when the output current Io is limited).

Figure 7:
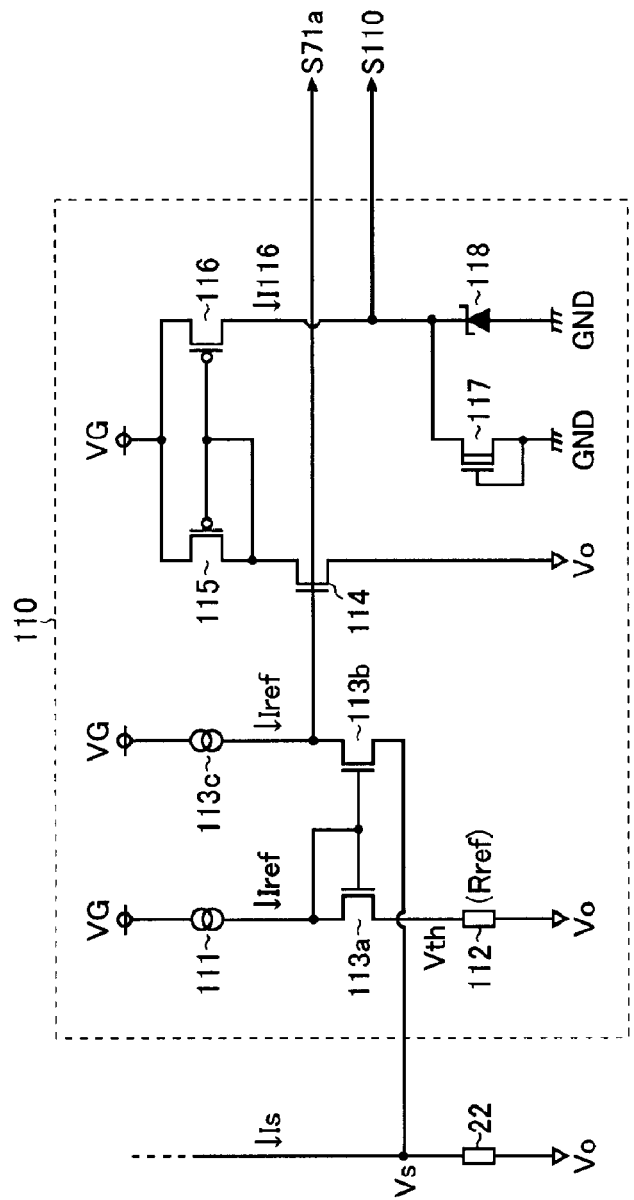
FIG. 7 is a circuit diagram showing a modification of the current control part.

FIG. 7 is a circuit diagram showing a modification of the current control part 110. The current control part 110 of this modification includes NMOSFETs 113a and 113b and a current source 113c as circuit elements that replace the comparator 113, based on the circuit configuration of FIG. 6.

The first terminals of the current sources 111 and 113c is connected to the application terminal of the boosted voltage VG. The second terminal of the current source 111 is connected to a drain of the NMOSFET 113a. A second terminal of the current source 113c is connected to a drain of the NMOSFET 113b. A source of the NMOSFET 113a is connected to the first terminal of the resistor 112. The second terminal of the resistor 112 is connected to the application terminal of the output voltage Vo. Gates of the NMOSFET 113a and 113b are both connected to the drain of the NMOSFET 113a. The sense voltage Vs is applied to a source of the NMOSFET 113b. The drain of the NMOSFET 113b corresponds to the output terminal of the first overcurrent protection signal S71a.

In this way, the current control part 110 may employ a comparator circuit using a current mirror as a circuit element which replaces the comparator 113 of FIG. 6.

Duty Control Part

Figure 8:
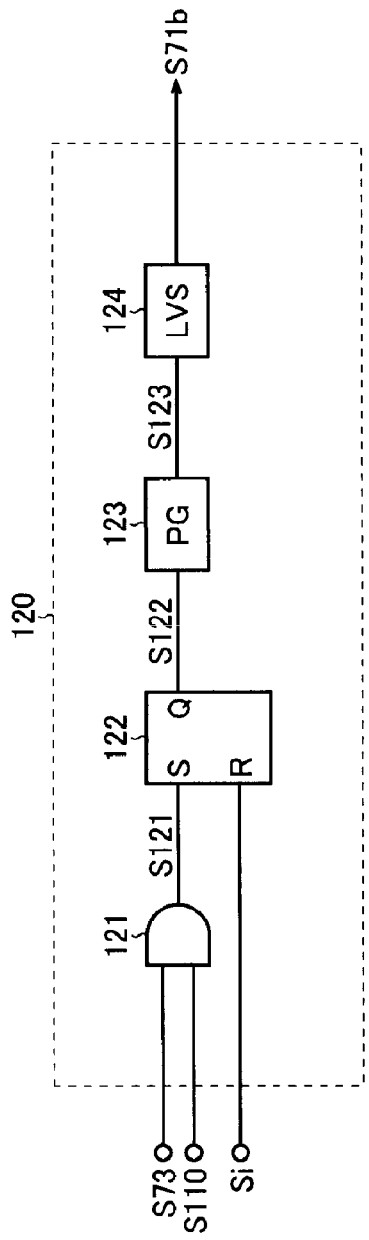
FIG. 8 is a circuit diagram showing a configuration example of a duty control part.

FIG. 8 is a circuit diagram showing a configuration example of the duty control part 120. The duty control part 120 of this configuration example includes an AND operator 121, an RS flip-flop 122, a pulse signal generator 123 and a level shifter 124.

The AND operator 121 generates an AND signal S121 by performing an AND operation of the state notification signal S110 and the temperature protection signal S73. The AND signal S121 has a high level when the state notification signal S110 and the temperature protection signal S73 are both at a high level, and has a low level when at least one of the state notification signal S110 and the temperature protection signal S73 is at a low level. That is, the AND signal S121 has a high level only when the state notification signal S110 is at a high level (a logic level at the time of current limitation) and the temperature protection signal S73 has a high level (a logic level at the time of abnormality detection).

The RS flip-flop 122 is a latch that switches a logic level of a pulse generation control signal S122 output from an output terminal (Q), according to the AND signal S121 input to a set terminal (S) and the external control signal Si input to a reset terminal (R).

For example, the RS flip-flop 122 sets the pulse generation control signal S122 at a high level (a logic level at the time of enabling) when the AND signal S121 rises to a high level, and resets the pulse generation control signal S122 at a low level (a logic level at the time of disabling) when the external control signal Si falls to a low level.

The pulse signal generator 123 generates a pulse signal S123 of the duty ratio Don over a high level period of the pulse generation control signal S122.

The level shifter 124 generates the second overcurrent protection signal S71b for forcibly turning on/off the NMOSFET at the duty ratio Don by level-shifting the pulse signal S123.

Pulse Signal Generator

Figure 9:
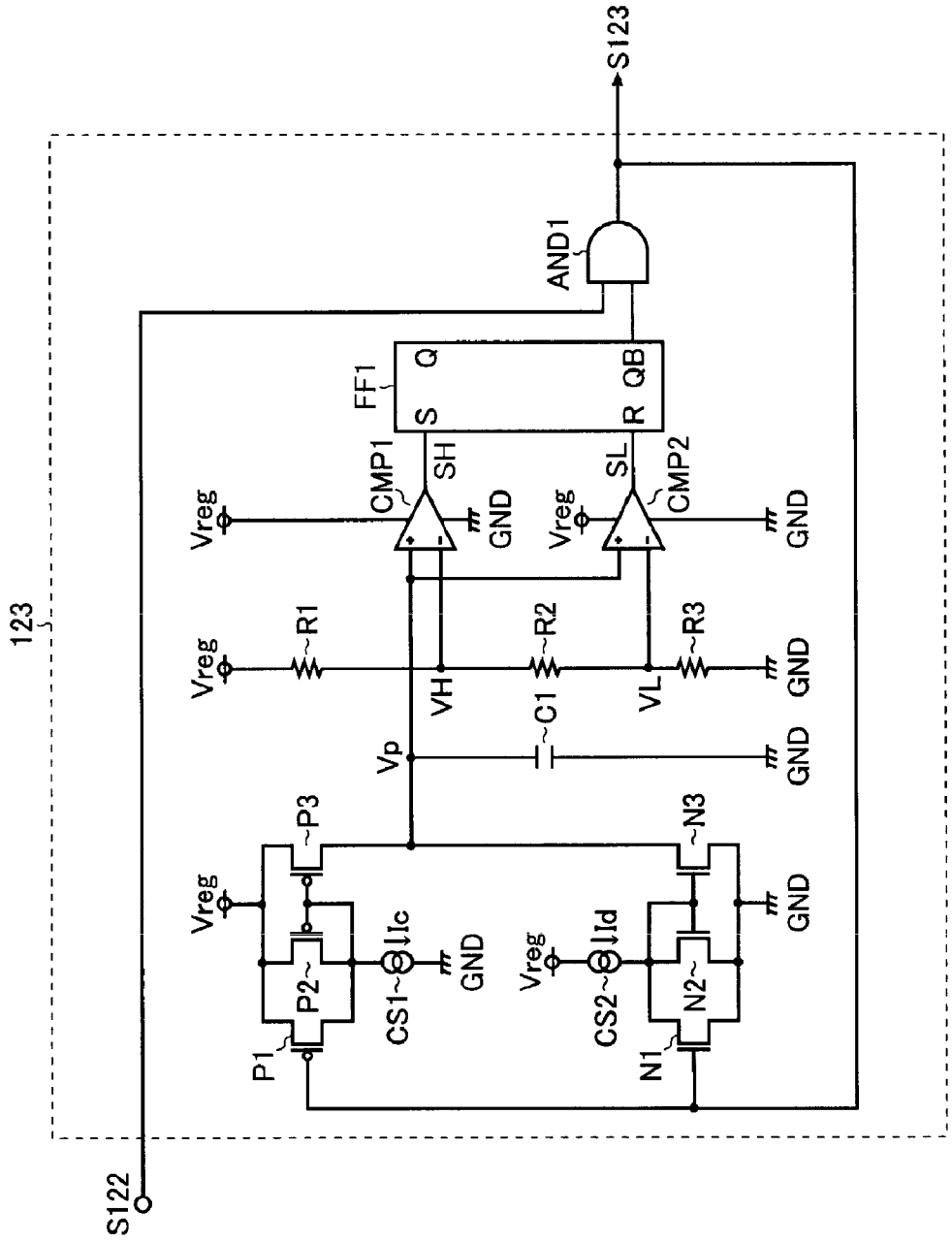
FIG. 9 is a circuit diagram showing a configuration example of a pulse signal generator.

FIG. 9 is a circuit diagram showing a configuration example of the pulse signal generator 123. The pulse signal generator 123 of this configuration example includes NMOSFETs N1 to N3, PMOSFETs P1 to P3, current sources CS1 and CS2, a capacitor C1, resistors R1 to R3, comparators CMP1 and CMP2, an RS flip-flop FF1 and an AND operator AND1.

Sources of the PMOSFETs P1 to P3 are all connected to the application terminal of the internal power supply voltage Vreg. Drains of the PMOSFETs P1 and P2 are both connected to a first terminal of the current source CS1. A second terminal of the current source CS1 is connected to the ground terminal GND. Gates of the PMOSFETs P2 and P3 are both connected to a drain of the PMOSFET P2.

Sources of the NMOSFETs N1 to N3 are both connected to the ground terminal GND. A first terminal of the current source CS2 is connected to the application terminal of the internal power supply voltage Vreg. A second terminal of the current source CS2 is connected to drains of the NMOSFETs N1 and N2. The gates of the NMOSFETs N2 and N3 are both connected to the drain of the NMOSFET N2.

A drain of the PMOSFET P3 and the drain of the NMOSFET N3 are both connected to a first terminal of a capacitor C1. A second terminal of the capacitor C1 is connected to the ground terminal.

Gates of the PMOSFET P1 and the NMOSFET N1 are both connected to an output terminal of the pulse signal S123. Accordingly, when the pulse signal S123 is at a high level, the PMOSFET P1 is turned off and the NMOSFET N1 is turned on. Conversely, when the pulse signal S123 is at a low level, the PMOSFET P1 is turned on and the NMOSFET N1 is turned off.

When the PMOSFET P1 is turned off and the NMOSFET N1 is turned on, an upper current mirror including the PMOSFETs P2 and P3 becomes effective and a lower current mirror composed of the NMOSFETs N2 and N3 becomes ineffective. Accordingly, the capacitor C1 is charged with a charging current Ic (more accurately, a drain current of the PMOSFET P3 mirroring the charging current Ic) generated by the current source CS1.

On the other hand, when the PMOSFET P1 is turned on and the NMOSFET N1 is turned off, the upper current minor becomes ineffective and the lower current mirror becomes effective. Accordingly, the capacitor C1 is discharged with a discharging current Id (more accurately, a drain current of the NMOSFET N3 mirroring the discharging current Id) generated by the current source CS2.

The resistors R1 to R3 are connected in series between the application terminal of the internal power supply voltage Vreg and the ground terminal GND. A connection node between the resistors R1 and R2 corresponds to an output terminal of an upper threshold voltage VH (=Vreg×(R2+R3)/(R1+R2+R3)) and a connection node between the resistors R2 and R3 corresponds to an output terminal of a lower threshold voltage VL (=Vreg×R3/(R1+R2+R3)). In this way, the resistors R1 to R3 function as a voltage divider for dividing the internal power supply voltage Vreg to generate the upper threshold voltage VH and the lower threshold voltage VL (<VH).

Power supply potential terminals of the comparators CMP1 and CMP2 are both connected to the application terminal of the internal power supply voltage Vreg. Reference potential terminals of the comparators CMP1 and CMP2 are both connected to the ground terminal GND. Non-inverting input terminals (+) of the comparators CMP1 and CMP2 are both connected to the first terminal (an output terminal of a charging voltage Vp) of the capacitor C1. Inverting input terminal (−) of the comparator CMP1 is connected to the connection node (an output terminal of the upper threshold voltage VH) between the resistors R1 and R2. Inverting input terminal (−) of the comparator CMP2 is connected to the connection node (an output terminal of the lower threshold voltage VL) between the resistors R2 and R3.

The comparator CMP1 compares the charging voltage Vp with the upper threshold voltage VH, thereby generating an upper comparison signal SH. The upper comparison signal SH has a high level (=Vreg) when the charging voltage Vp is higher than the upper threshold voltage VH, and has a low level (=GND) when the charging voltage Vp is lower than the upper threshold voltage VH.

The comparator CMP2 compares the charging voltage Vp with the lower threshold voltage VL, thereby generating a lower comparison signal SL. The lower comparison signal SL has a high level (=Vreg) when the charging voltage Vp is higher than the lower threshold voltage VL, and has a low level (=GND) when the charging voltage Vp is lower than the lower threshold voltage VL.

The RS flip-flop FF1 has a latch that switches a logic level of a latch output signal SO output from an inverting output terminal (QB), according to the upper comparison signal SH input to a set terminal (S) and the lower comparison signal SL input to a reset terminal (R).

For example, the RS flip-flop FF 1 sets the latch output signal SO at a low level (a logic level at the time of cancellation of forced-off) when the upper comparison signal SH rises to a high level, and resets the latch output signal SO at a high level (a logic level at the time of forced-off) when the lower comparison signal SL falls to a low level. In this case, the latch output signal SO is a square wave signal having a low level when the charging voltage Vp rises to the upper threshold voltage VH and having a high level when the charging voltage Vp drops to the lower threshold voltage VL.

The AND operator ANDI generates the pulse signal S123 by performing an AND operation of the pulse generation control signal S122 and the latch output signal SO. The pulse signal S123 has a high level when the pulse generation control signal S122 and the latch output signal SO are both at a high level, and has a low level when at least one of the pulse generation control signal S122 and the latch output signal SO is at a low level. That is, when the pulse generation control signal S122 is at a high level (a logic level at the time of enabling), the latch output signal SO is through-outputted as the pulse signal S123. On the other hand, when the pulse generation control signal S122 is at a low level (a logic level at the time of disabling), the pulse signal S123 is fixed at a low level without depending on the logic level of the latch output signal SO.

Overcurrent Protection Operation

Figure 10:
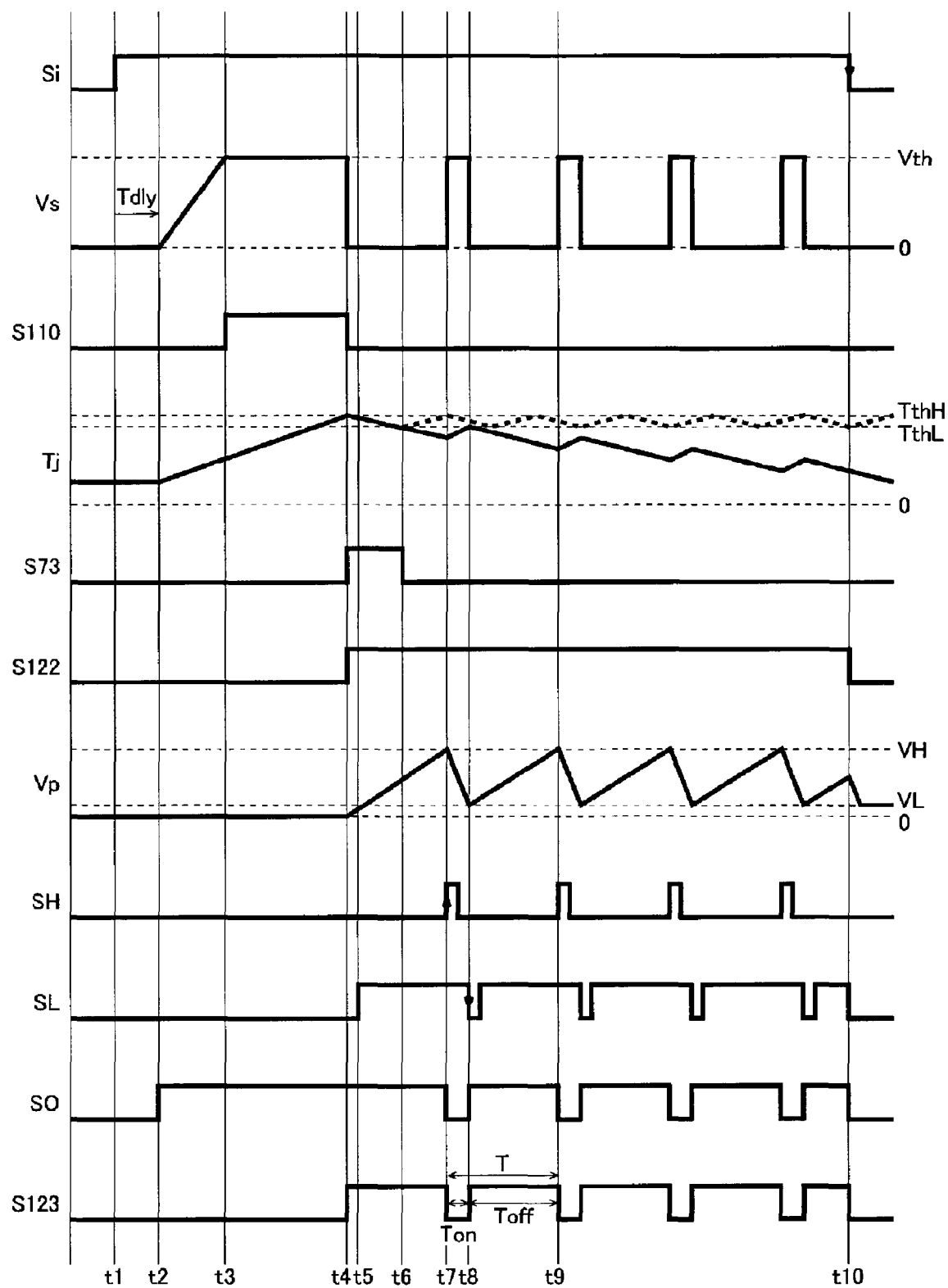
FIG. 10 is a timing chart showing an example of an overcurrent protection operation.

FIG. 10 is a timing chart showing an example of the overcurrent protection operation, in which the external control signal Si, the sense voltage Vs, the state notification signal S110, the junction temperature Tj, the temperature protection signal S73, the pulse generation control signal S122, the charging voltage Vp, the upper comparison signal SH, the lower comparison signal SL, the latch output signal SO and the pulse signal S123 are depicted in order from the top.

At time t1, when the external control signal Si rises to a high level, the generation operation of the reference current Iref (not shown in this figure) starts without delay and the semiconductor integrated circuit device 1 enters a standby state. However, at time t1, since shutdown of the semiconductor integrated circuit device 1 is not released and the NMOSFET 10 is kept off, the output current Io does not flow to the NMOSFET 10. Accordingly, the sense voltage Vs is kept at 0V.

At time t2, when a predetermined activation delay period Tdly (e.g., 5 μs) elapses from time t1, the shutdown of the semiconductor integrated circuit device 1 is released. As a result, since the NMOSFET 10 is turned on and the output current Io starts to flow, the sense voltage Vs starts to rise. In this figure, the RS flip-flop FF1 is activated at this point and the latch output signal SO rises to the high level, but since the pulse generation control signal S122 is kept at the low level, the pulse signal S123 is also kept at the low level. Accordingly, since the capacitor C1 is discharged with the discharging current Id, the charging voltage Vp is kept at 0V.

After that, the output current Io continues to increase and, at time t3, when the sense voltage Vs becomes higher than the threshold voltage Vth, the output current Io is limited below the upper limit value by the current control mode described above. At this time, the state notification signal S110 rises to a high level (a logic level at the time of current limitation), but since the junction temperature Tj is lower than the upper threshold temperature TthH, the temperature protection signal S73 remains at a low level. Accordingly, the pulse generation control signal S122 is kept at the low level.

In this way, as long as no temperature abnormality is detected, an instantaneous current at start-up can be secured if overcurrent protection by the current control mode is applied. Accordingly, for example, when a bulb lamp as the load 3 is connected, it is possible to sufficiently warm up and activate the bulb lamp.

On the other hand, since the output current Io is maintained near the upper limit value when the load is short-circuited, the NMOSFET 10 continues to generate heat. As a result, at time t4, the junction temperature Tj becomes higher than the upper threshold temperature TthH and the temperature protection signal S73 rises to a high level.

In this manner, when both the state notification signal S110 and the temperature protection signal S73 go to the high level, since the pulse generation control signal S122 rises to the high level, the latch output signal SO as the pulse signal S123 is through-output. The latch output signal SO is already at the high level at this time. Accordingly, the pulse signal S123 rises to the high level without delay at the point of time when the pulse generation control signal S122 rises to a high level.

When the pulse signal S123 rises to the high level, the MOSFET 10 is forcibly turned off. Accordingly, since the output current Io does not flow and the sense voltage Vs decreases to 0V, the status notification signal S110 falls to a low level. However, the pulse generation control signal S122 remains at the high level. In addition, as the MOSFET 10 is forcibly turned off, the junction temperature Tj changes from rising to falling. In addition, since the charging of the capacitor C1 with the charging current Ic starts, the charging voltage Vp starts to rise.

At time t5, when the charging voltage Vp becomes higher than the lower threshold voltage VL the lower comparison signal SL rises to a high level, but the logic level of the latch output signal SO does not change.

At time t6, when the junction temperature Tj becomes lower than the lower threshold temperature TthL, the temperature protection signal S73 falls to a low level. However, the pulse generation control signal S122 is still maintained at the high level.

At time t7, when the charging voltage Vp rises to the upper threshold voltage VH, the upper comparison signal SH rises to a high level. Accordingly, since the latch output signal SO is set at a low level, the pulse signal S123 also falls to a low level. As a result, since the forced-off of the MOSFET 10 is released and the output current Io starts to flow again, the sense voltage Vs and the junction temperature Tj turn to rise. In addition, since the discharging of the capacitor C1 with the discharging current Id starts, the charging voltage Vp starts to decrease.

At time t8, when the charging voltage Vp drops to the lower threshold voltage VL, the lower comparison signal SL falls to a low level. Accordingly, since the latch output signal SO is reset to a high level, the pulse signal S123 also rises to a high level. As a result, since the MOSFET 10 is again forcibly turned off, the sense voltage Vs drops to 0V and the junction temperature Tj changes from rising to falling. In addition, since the charging of the capacitor C1 with the charging current Ic resumes, the charging voltage Vp starts to increase.

At time t9, when the charging voltage Vp rises again to the upper threshold voltage VH, the upper comparison signal SH rises to the high level, the latch output signal SO is set to the low level, and the pulse signal S123 falls to the low level. As a result, since the forced-off of the MOSFET 10 is released, the sense voltage Vs and the junction temperature Tj turn to rise. In addition, since the discharging of the capacitor C1 with the discharging current Id starts, the charging voltage Vp starts to decrease. This operation is exactly the same as the operation at time t7.

Even after time t9, similarly to the above, the pulse signal S123 alternates between the high level period and the low level period. At time t10, when the external control signal Si falls to a low level, the semiconductor integrated circuit device 1 is shut down to complete the above-described series of operations.

With attention on the pulse generation operation after time t4, the low level period (for example, time t7 to time t8) of the pulse signal S123 corresponds to the ON period Ton (the forced-off release period) of the NMOSFET 10 and the high level period (for example, time t8 to time t9) of the pulse signal S123 corresponds to the OFF period Toff (the forced-off period) of the NMOSFET 10.

That is, after time t4, the NMOSFET 10 alternates between the ON period Ton and the OFF period Toff at a predetermined duty ratio Don (Ton/T, where T=Ton+Toff). In other words, the overcurrent protection circuit 71 switches from the current control mode to the duty control mode after time t4.

The duty ratio Don may be set so that the junction temperature Tj surely decreases to a safe temperature range after time t4. For example, when Don is set to 4% (Ton=20 to 30 μs and Toff=500 to 700 μs), after time t4, unlike the conventional self-reset type thermal shutdown (see the broken line in the figure), the junction temperature Tj will not be maintained at a high temperature range (150 to 175 degrees C.) but can be lowered to a sufficiently safe temperature range (about 70 to 80 degrees C.), thereby enhancing the safely of the semiconductor integrated circuit device 1.

In particular, it can be said that the above-described duty control mode is a very effective control method for clearing a reliability test peculiar to in-vehicle equipment (for example, a load short reliability test (AEC (Automotive Electronics Council) Q100-012 for evaluating safety at the time of output terminal short-circuit or ground fault).

In addition, when the overcurrent protection by the current control mode is performed until a temperature abnormality is detected, and then the overcurrent protection by the duty control mode is performed after the temperature abnormality is detected, it is possible to achieve both instantaneous current securing and safety improvement, so that it is possible to flexibly cope with various specifications of the load 3 and also to clear the functional safety required for the semiconductor integrated circuit device 1 at a high level.

At time t4, after the pulse generation control signal S122 rises to the high level and the current control mode is switched to the duty control mode, the generation operation of the pulse signal S123 is continued until the external control signal Si falls to a low level and the pulse generation control signal S122 is reset to a low level (a logic level at the time of disabling). That is, once the current control mode is switched to the duty control mode, there is no return to the current control mode until the semiconductor integrated circuit device 1 is restarted (Si=L→H).

Figure 11:
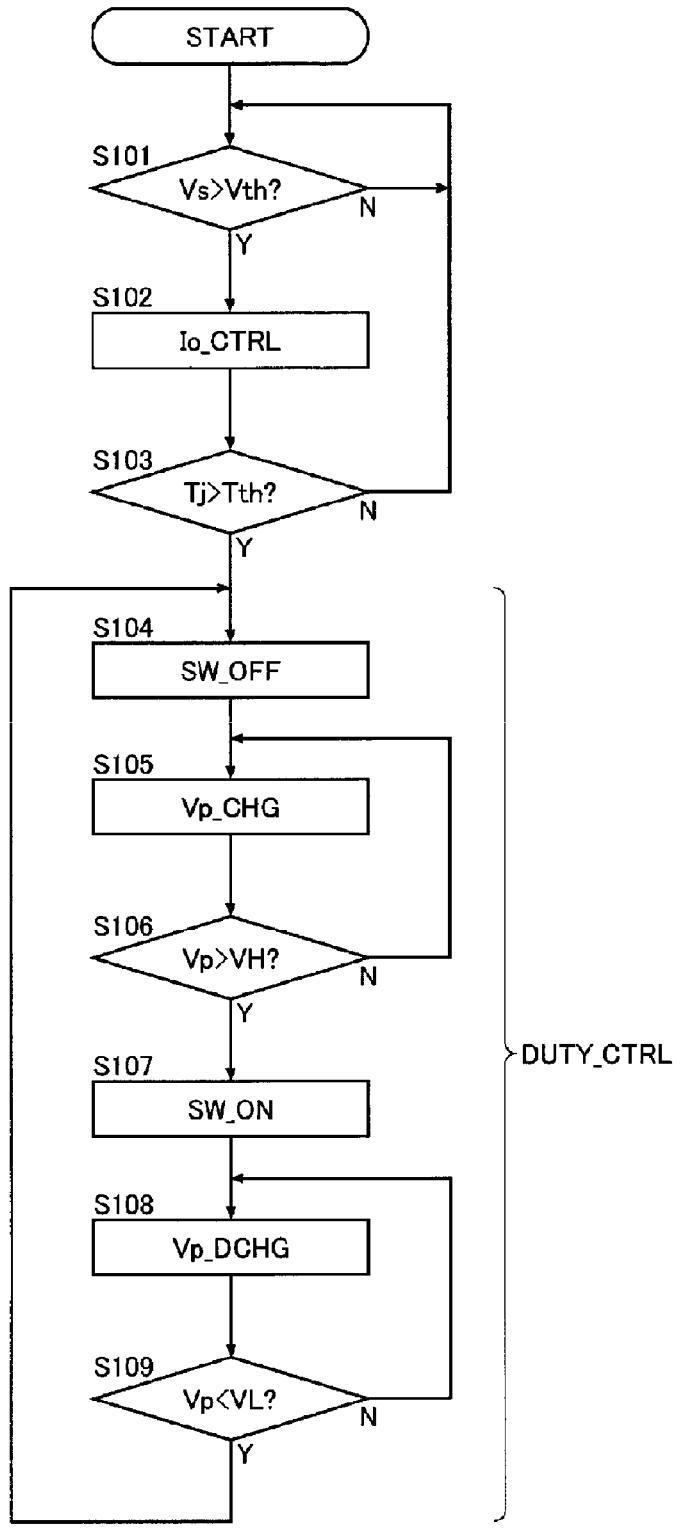
FIG. 11 is a flowchart showing an example of an overcurrent protection operation.

FIG. 11 is a flowchart showing an example of the overcurrent protection operation. When this flow starts, first, in step S101, it is determined whether or not the sense voltage Vs is higher than the threshold voltage Vth. If a YES determination is made in this step, the flow proceeds to step S102. On the other hand, if a NO determination is made, the flow returns to step S101 and the determination in this step is repeated (which corresponds to times t1 to t3 in FIG. 10).

In step S102, upon receiving the YES determination in step S101, the output current Io is limited to a predetermined upper limit value or less by the current control mode (which corresponds to times t3 to t4 in FIG. 10).

In the subsequent step S103 it is determined whether or not the junction temperature Tj is higher than the threshold temperature Tth. If a YES determination is made in this step, the flow proceeds to step S104. On the other hand, if a NO determination is made, the flow returns to step S101 (which corresponds to times t3 to t4 in FIG. 10).

In step S104, the NMOSFET 10 is forcibly turned off in response to the YES determination in step S103 (which corresponds to time t4 in FIG. 10).

In step S105, the capacitor C1 starts to be charged and the charging voltage Vp starts to rise (which corresponds to time t4 in FIG. 10).

In the subsequent step S106, it is determined whether or not the charging voltage Vp rises to the upper threshold voltage VH. If a YES determination is made in this step, the flow proceeds to step S107. On the other hand, if a NO determination is made, the flow returns to step S105 in which the charging of the capacitor C1 is continued (which corresponds to times t4 to t7 in FIG. 10).

In step S107, in response to the YES determination in step S106, the forced-off of the NMOSFET 10 is released (which corresponds to time t7 in FIG. 10).

In step S108, the capacitor C1 starts to be discharged and the charging voltage Vp starts to drop (which corresponds to time t7 in FIG. 10).

In the subsequent step S109, it is determined whether or not the charging voltage Vp drops to the lower threshold voltage VL. If a NO determination is made in this step, the flow returns to step S108 and the charging of the capacitor C1 is continued (which corresponds to times t7 to t8 in FIG. 10). On the other hand, if a YES determination is made, the flow returns to step S104 and the NMOSFET 10 is again forcibly turned off (which corresponds to time t8).

That is, by repeating steps S104 to S109, the overcurrent protection by the above-described duty control mode is applied.

Temperature Protection Circuit (Modification)

Figure 12:
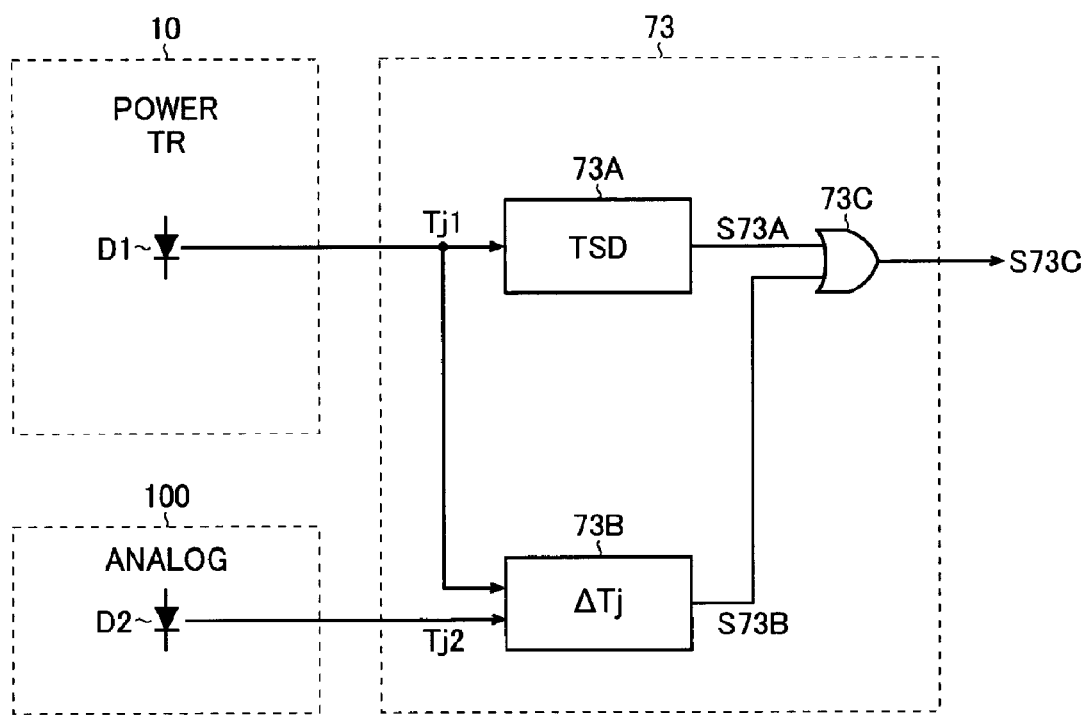
FIG. 12 is a block diagram showing a modification of the temperature protection circuit.

FIG. 12 is a block diagram showing a modification of the temperature protection circuit 73. The temperature protection circuit 73 according to this modification includes a first temperature detector 73A, a second temperature detector 73B and an OR operator 73C.

The first temperature detector 73A detects a junction temperature Tj1 of the NMOSFET 10 by using a temperature detecting element D1 provided inside or near the NMOSFET 10 and compares it with a predetermined upper limit temperature Tth (for example, 175 degrees C.) to generate a first temperature protection signal S73A. The first temperature protection signal S73A has a low level (a logic level when no abnormality is detected) when the junction temperature Tj1 is lower than the upper limit temperature Tth, and has a high level (a logic level when an abnormality is detected) when the junction temperature Tj1 is higher than the upper limit temperature Tth. That is, it can be said that the first temperature detector 73A corresponds to the above-described temperature protection circuit 73 shown in FIG. 3.

The second temperature detector 73B detects a junction temperature Tj2 of an integrated circuit 100 (the control logic part 40 or the like) by using a temperature detecting element D2 provided inside or near the integrated circuit 100 excluding the NMOSFET 10 and compares a temperature difference ΔTj (=Tj1−Tj2) between the junction temperature Tj1 and the junction temperature Tj2 with a predetermined upper limit temperature difference ΔTth (for example, 60 degrees C.) to generate a second temperature protection signal S73B. The second temperature protection signal S73B has a low level (a logic level when no abnormality is detected) when the temperature difference ΔTj is smaller than the upper limit temperature difference ΔTth, and has a high level (a logic level when an abnormality is detected) when the temperature difference ΔTj is larger than the upper limit temperature difference ΔTth.

The OR operator 73C generates a third temperature protection signal S73C by performing an OR operation of the first temperature protection signal S73A and the second temperature protection signal S73B. The third temperature protection signal S73C has a low level when both the first temperature protection signal S73A and the second temperature protection signal S73B are at a low level, and has a high level when at least one of the first temperature protection signal S73A and the second temperature protection signal S73B is at a high level. The third temperature protection signal S73C is output to the overcurrent protection circuit 71 (particularly, the duty control part 120), instead of the above-described temperature protection signal S73 (see FIGS. 2, 5, 8, etc.).

By adopting the temperature protection circuit 73 of this modification, the overcurrent protection circuit 71 can be switched from the current control mode to the duty control mode not only when an abnormality of the junction temperature Tj1 is detected (S73A=H) but also when an abnormality of the temperature difference ΔTj is detected (S73B=H).

Semiconductor Integrated Circuit Device (Second Embodiment)

Figure 13:
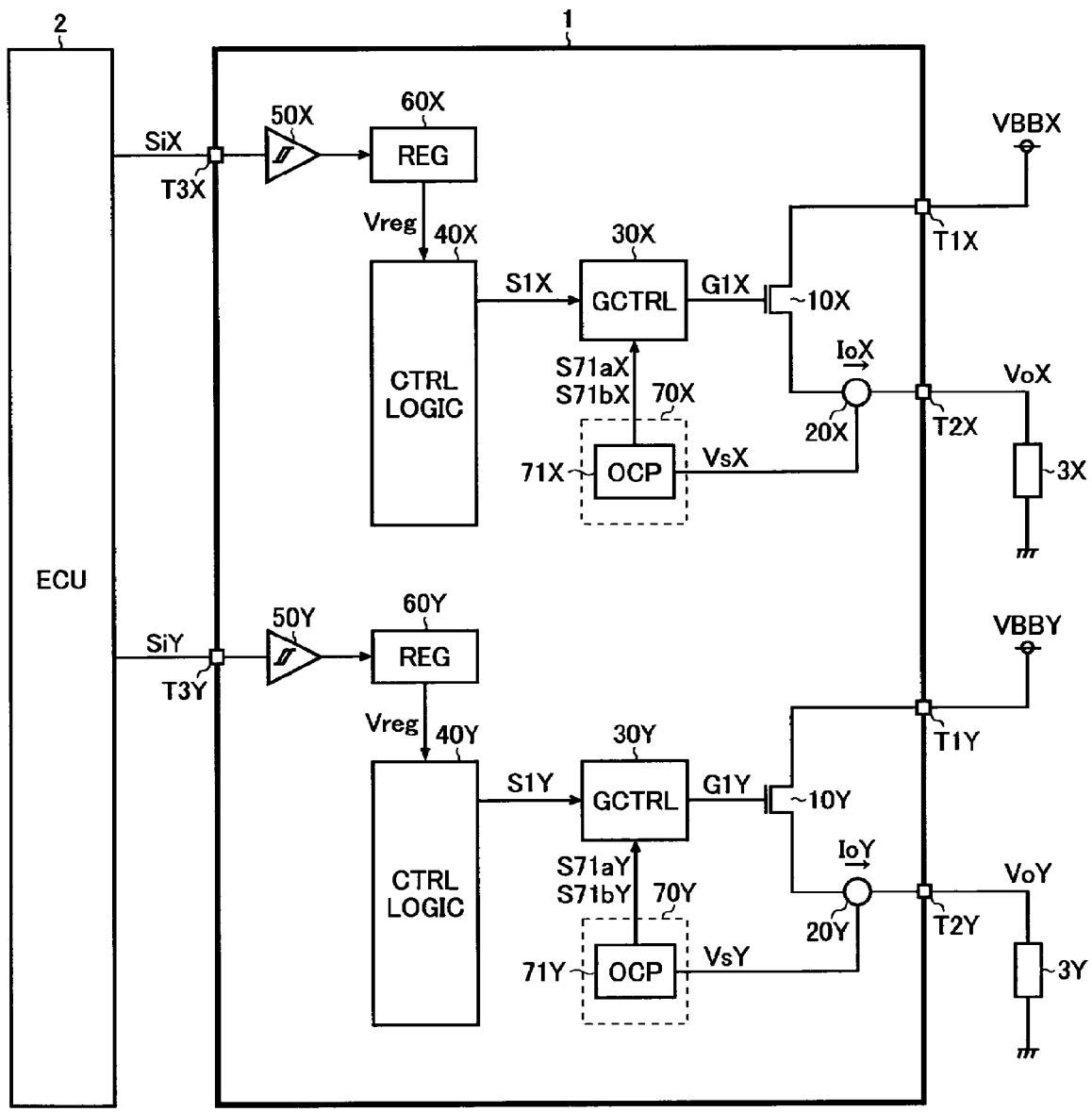
FIG. 13 is a block diagram showing a semiconductor integrated circuit device according to a second embodiment.

FIG. 13 is a block diagram showing a semiconductor integrated circuit device according to a second embodiment. The semiconductor integrated circuit device 1 of this embodiment has the above-described constituent elements (the functional blocks 10 to 90, the external terminals T1 to T3, various voltages, currents and signals, etc.) for each channel, based on the first embodiment (FIG. 1), in order to individually drive two-channel loads 3X and 3Y.

"X" is appended to the end of the symbol for the constituent elements related to the driving of the load 3X and "Y" is appended to the end of the symbol for the constituent elements related to the driving of the load 3Y but the operations and functions thereof are basically the same as the above-mentioned constituent elements not appended with "X" and "Y" at the end. For example, the operations and functions of NMOSFETs 10X and 10Y are basically the same as that of the aforementioned NMOSFET 10. The same applies to other constituent elements. In this figure, for convenience of illustration, output current detectors 80X and 80Y and signal output parts 90X and 90Y are not explicitly shown, but these functional blocks will be described in detail together with a multiplexer to be described below.

Multiplexer

Figure 14:
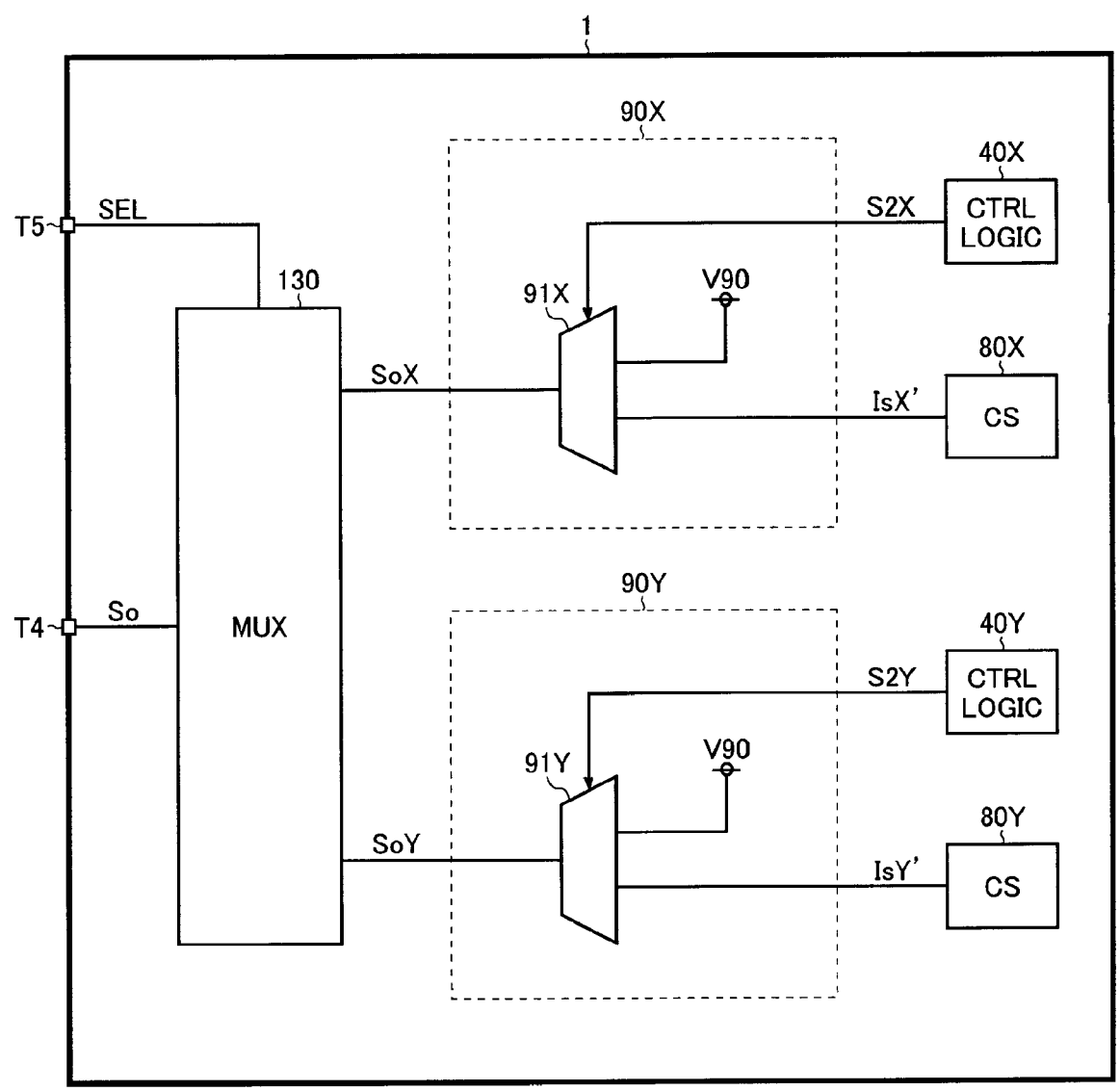
FIG. 14 is a block diagram showing an example of introduction of a multiplexer.

FIG. 14 is a block diagram showing an example in which a multiplexer is introduced as an output stage of the status signal So with the two-channelization of the semiconductor integrated circuit device 1 described so far. In the semiconductor integrated circuit device 1 of this configuration example, the output current detectors 80X and 80Y, the signal output parts 90X and 90Y, the multiplexer 130 and an external terminal T5 are integrated.

The output current detector 80X generates a sense current IsX' corresponding to an output current IoX and outputs it to the signal output part 90X.

The output current detector 80Y generates a sense current IsY' corresponding to an output current IoY and outputs it to the signal output part 90Y.

The signal output part 90X includes a selector 91X that selectively outputs one of the sense current IsX' (corresponding to a result of detection of the output current IoX) and a fixed voltage V90 (corresponding to an abnormality flag) as a first status signal SoX based on an output selection signal S2X input from a control logic part 40X. The selector 91X selectively outputs the sense current IsX' as the first status signal SoX when the output selection signal S2X is at a logic level (for example, low level) when no abnormality is detected, and outputs the fixed voltage V90 as the first status signal SoX when the output selection signal S2X is at a logic level (for example, high level) when an abnormality is detected.

The signal output part 90Y includes a selector 91Y that selectively outputs one of the sense current IsY' (corresponding to a result of detection of the output current IoY) and the fixed voltage V90 (corresponding to the abnormality flag) as a second status signal SoY based on an output selection signal S2Y input from a control logic part 40Y. The selector 91Y selectively outputs the sense current IsY' as the second status signal SoY when the output selection signal S2Y is at a logic level (for example, low level) when no abnormality is detected, and outputs the fixed voltage V90 as the second status signal SoY when the output selection signal S2Y is at a logic level (for example, high level) when an abnormality is detected.

In response to an output selection signal SEL input to the external terminal T5, the multiplexer 130 selectively outputs one of a first status signal SoX (the sense current IsX' or the fixed voltage V90) and a second status signal SoY (the sense current IsY' or the fixed voltage V90) to the external terminal T4.

When the sense current IsX' is selectively output to the external terminal T4, an output detection voltage V80X (=IsX'×R4) obtained by current/voltage conversion of the sense current IsX' by the external sense resistor 4 is output as the status signal So to the ECU 2. The output detection voltage V80X increases with the increase in the output current IoX and decreases with the decrease in the output current IoX.

When the sense current IsY' is selectively output to the external terminal T4, an output detection voltage V80Y (=IsY'×R4) obtained by current/voltage conversion of the sense current IsY' by the external sense resistor 4 is output as the status signal So to the ECU 2. The output detection voltage V80Y increases with the increase in the output current IoY and decreases with the decrease in the output current IoY.

On the other hand, when the fixed voltage Y90 is selectively output to the external terminal T4, it is transmitted as the status signal So to the ECU 2. The fixed voltage V90 may be set to a voltage value higher than the upper limit values of the output detection voltages V80X and V80Y.

With the introduction of such a multiplexer 130, it is possible to externally monitor both the detection results of the output currents IoX and IoY and the abnormality flag for an arbitrary channel.

IC Layout

Figure 15:
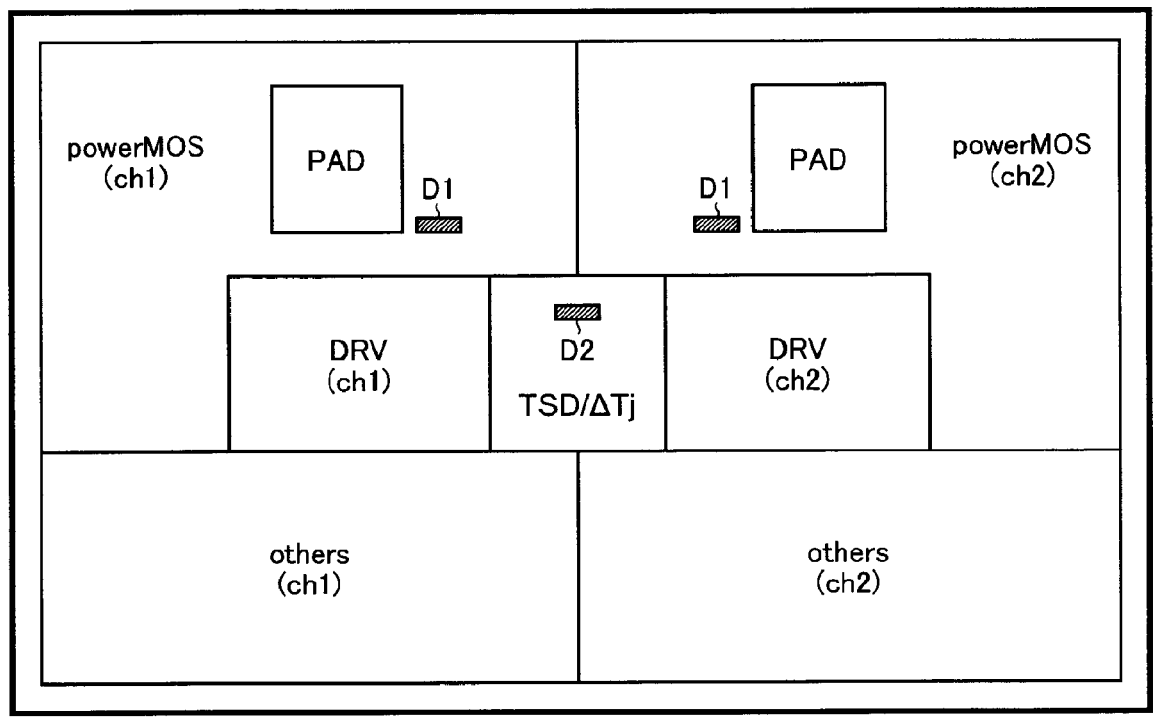
FIG. 15 is a layout diagram of a semiconductor integrated circuit device.

FIG. 15 is a layout of the two-channel semiconductor integrated circuit device 1. As shown in this figure, power MOSFETs (corresponding to the NMOSFETs 10X and 10Y in FIG. 13) of each channel are arranged not on the central portion but on the side portion of the chip. The power MOSFETs of each channel are formed in an L shape when viewed from top. This is common as a shape for increasing the resistance against inductive loads such as inductors.

A driver DRV (corresponding to the gate control parts 30X and 30Y in FIG. 13) and a temperature protection circuit TSD/ΔTj (corresponding to the temperature protection circuit 73 in FIG. 12) of each channel are formed in the central portion of the chip, which are surrounded by the power MOSFETs of the channel or other circuit elements.

It is desirable that the temperature detection element D1 for detecting the temperature of the power MOSFET be disposed in a place where heat is most likely to be concentrated in a formation region of the power MOSFET. In simple terms, it seems that this place is the central portion of the power MOSFET, but in reality, a point where the heat concentration is most likely to occur is determined depending on the layout of pads and the area of the power MOSFET. In the example of this figure, since the power MOSFET has two channels, in consideration of left and right uniformity and ease of layout wiring, the temperature detecting element D1 is located near the pads of the power MOSFET (in particular, near a corner closest to the temperature protection circuit TSD/ΔTj among four corners of the pads) and the position of the pads are adjusted so that the heat generation is most concentrated at the location.

In addition, it is unnecessary to keep the temperature detecting element D2 for detecting the temperature of the integrated circuit other than the power MOSFET away from the power MOSFET, but rather, the temperature detecting element D2 may be disposed near the power MOSFET in view of detection accuracy. In the example of this figure, the temperature detecting element D2 is disposed within the formation region of the temperature protection circuit TSD/ΔTj adjacent to the power MOSFET. The temperature of the power MOSFET rises quickly when the power MOSFET is turned on to flow a current, and falls when the power MOSFET is turned off. On the other hand, the temperature of the temperature protection circuit TSD/ΔTj gradually changes due to the heat generation of the power MOSFET. In the temperature protection circuit TSD/ΔTj (particularly the second temperature detector 73B in FIG. 12), a temperature difference between them is monitored.

Applications to Vehicle

Figure 16:
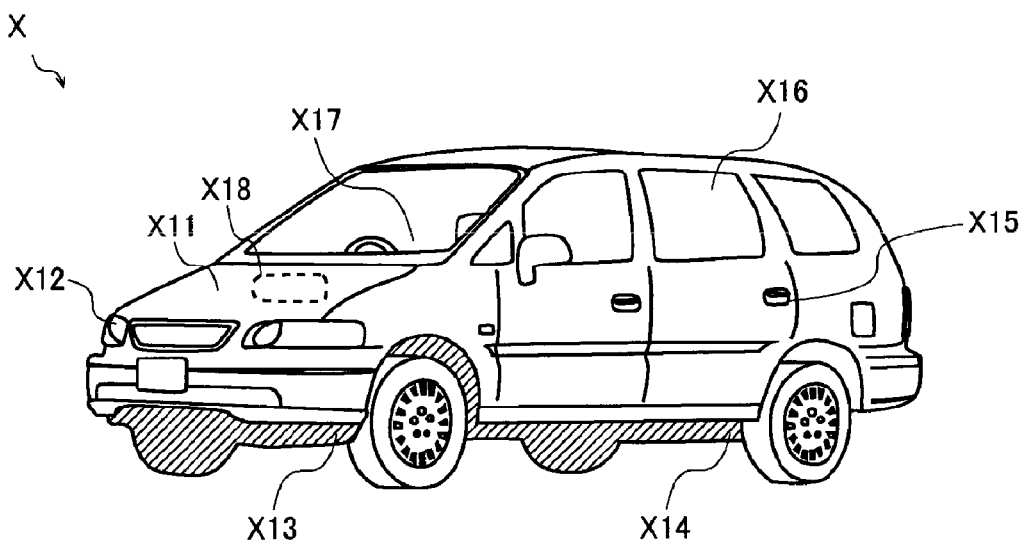
FIG. 16 is an external view showing a configuration example of a vehicle.

FIG. 16 is an external view showing a configuration example of a vehicle. The vehicle X of this configuration example is equipped with a battery (not shown in the drawing) and various electronic apparatuses X11 to X18 which are operated with power supplied from the battery. The mounting positions of the electronic apparatuses X11 to X18 in this figure may be different from the actual positions for convenience of illustration.

The electronic apparatus X11 is an engine control unit that performs engine-related control (injection control, electronic throttle control, idling control, oxygen sensor heater control, auto cruise control, etc.).

The electronic apparatus X12 is a lamp control unit that performs on/off control of HID (High Intensity Discharged lamp) or DRL (Daytime Running Lamp).

The electronic apparatus X13 is a transmission control unit that performs transmission-related control.

The electronic apparatus X14 is a body control unit that performs control related to the motion of the vehicle X (ABS (Anti-lock Brake System) control, EPS (Electric Power Steering) control, electronic suspension control, etc.).

The electronic apparatus X15 is a security control unit that performs control of driving of a door lock, a security alarm, etc.

The electronic apparatus X16 is an electronic apparatus incorporated in the vehicle X at the factory shipment stage as standard equipment or a maker optional item such as a wiper, an electric door mirror, a power window, a damper shock absorber), an electric sunroof, an electric seat, and the like.

The electronic apparatus X17 is an electronic apparatus that is optionally mounted on the vehicle X as a user optional item such as an in-vehicle AN (Audio/Visual) device, a car navigation system, an ETC (Electronic Toll Collection system), and the like.

The electronic apparatus X18 is an electronic apparatus including a high-voltage resistant motor such as an in-vehicle blower, an oil pump, a water pump, a battery cooling fan, and the like.

The semiconductor integrated circuit device 1, the ECU 2 and the load 3 described above can be incorporated in any of the electronic apparatuses X11 to X18.

Other Modifications

Further, in the above embodiments, the description has been given taking the in-vehicle high-side switch IC as an example, but the present disclosure is not limited thereto. For example, the present disclosure can be widely applied not only to other in-vehicle IPD (in-vehicle low-side switch ICs, in-vehicle power supply ICs, etc.) but also to semiconductor integrated circuit devices other than vehicle applications.

INDUSTRIAL APPLICABILITY

The present disclosure can be used for, for example, an in-vehicle IPD (such as an in-vehicle switch having high versatility).

According to the present disclosure in some embodiments, it is possible to provide an overcurrent protection circuit capable of securing an instantaneous current while improving safety.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An overcurrent protection circuit comprising:
a current controller configured to control a transistor to limit a flowing output current to a predetermined upper limit or less while keeping the transistor turned on; and
a duty controller configured to turn on/off the transistor at a predetermined duty ratio when a temperature protection circuit detects a temperature abnormality,
wherein the current controller is further configured to:
compare a sense voltage corresponding to the output current with a threshold voltage corresponding to the predetermined upper limit; and
generate a first overcurrent protection signal configured to control the the transistor and a state notification signal configured to notify the duty controller of a state where the current controller limits the output current,
wherein the duty controller includes:
a latch configured to switch and hold a pulse generation control signal from a logic level at the time of disabling to a logic level at the time of enabling when the state notification signal is at a logic level at the time of current limitation and a temperature protection signal is at a logic level at the time of abnormality detection;
a pulse signal generator configured to generate a pulse signal having the duty ratio while the pulse generation control signal is at the logic level at the time of enabling; and
a level shifter configured to generate a second overcurrent protection signal configured to turn on/off the transistor at the duty ratio by level-shifting the pulse signal.

2. The overcurrent protection circuit of claim 1, wherein the transistor is turned on/off at the predetermined duty ratio when the temperature abnormality is detected in a state where the output current is limited.

3. The overcurrent protection circuit of claim 1, wherein the transistor is kept turned on when the transistor does not limit the output current.

4. The overcurrent protection circuit of claim 1, wherein the pulse signal generator is configured to continue generating the pulse signal until the pulse generation control signal is reset to the logic level at the time of disabling.

5. A semiconductor integrated circuit device comprising:
a transistor configured to conduct/interrupt a current path through which an output current flows;
a gate controller configured to generate a driving signal of the transistor in response to a control signal;
a temperature protection circuit configured to detect a temperature abnormality of the device; and
the current protection circuit of claim 1.

6. The semiconductor integrated circuit device of claim 5, wherein the temperature protection circuit is configured to monitor a temperature of the transistor and detect a temperature abnormality.

7. A semiconductor integrated circuit device comprising:
a transistor configured to conduct/interrupt a current path through which an output current flows;
a gate controller configured to generate a driving signal of the transistor in response to a control signal;
a temperature protection circuit configured to monitor a temperature of the transistor and to detect a temperature abnormality of the device, wherein a first temperature detecting element for detecting the temperature of the transistor is disposed near a pad of the transistor within a formation region of the transistor; and
an overcurrent protection circuit comprising:
a current controller configured to control the transistor to limit the output current to a predetermined upper limit or less while keeping the transistor turned on; and
a duty controller configured to turn on/off the transistor at a predetermined duty ratio when the temperature protection circuit detects the temperature abnormality.

8. The semiconductor integrated circuit device of claim 7, wherein the temperature protection circuit is formed adjacent to the transistor and the first temperature detecting element is disposed near a corner closest to the temperature protection circuit among four corners of the pad.

9. A semiconductor integrated circuit device comprising:
a transistor configured to conduct/interrupt a current path through which an output current flows;
a gate controller configured to generate a driving signal of the transistor in response to a control signal;
a temperature protection circuit configured to monitor a temperature difference between a temperature of the transistor and a temperature of another integrated circuit and to detect a temperature abnormality of the device; and
an overcurrent protection circuit comprising:
a current controller configured to control the transistor to limit the output current to a predetermined upper limit or less while keeping the transistor turned on; and
a duty controller configured to turn on/off the transistor at a predetermined duty ratio when the temperature protection circuit detects the temperature abnormality.

10. The semiconductor integrated circuit device of claim 9, wherein the temperature protection circuit is formed adjacent to the transistor, and wherein a temperature detecting element configured to detect the temperature of the other integrated circuit is disposed in a formation region of the temperature protection circuit.

11. An electronic apparatus comprising:
the semiconductor integrated circuit device of claim 5; and
a load connected to the semiconductor integrated circuit device.

12. The electronic apparatus of claim 11, wherein the load is a bulb lamp, a relay coil, a solenoid, a light emitting diode or a motor.

13. A vehicle comprising the electronic apparatus of claim 11.

* * * * *